United States Patent
Lee

(10) Patent No.: US 9,508,424 B2
(45) Date of Patent: Nov. 29, 2016

(54) NONVOLATILE MEMORY AND PROGRAMMING METHOD USING THIRD LATCH FOR VERIFICATION READ RESULTS

(71) Applicant: Ji-Sang Lee, Jeollabuk-Do (KR)

(72) Inventor: Ji-Sang Lee, Jeollabuk-Do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/674,005

(22) Filed: Mar. 31, 2015

(65) Prior Publication Data

US 2016/0071581 A1 Mar. 10, 2016

(30) Foreign Application Priority Data

Sep. 4, 2014 (KR) .......................... 10-2014-0117793

(51) Int. Cl.
*G11C 11/34* (2006.01)
*G11C 11/56* (2006.01)
*G11C 16/34* (2006.01)

(52) U.S. Cl.
CPC ........ *G11C 11/5671* (2013.01); *G11C 11/5628* (2013.01); *G11C 16/3459* (2013.01); *G11C 2211/5621* (2013.01)

(58) Field of Classification Search
None
See application file for complete search history.

(56) References Cited

U.S. PATENT DOCUMENTS

| 6,711,054 | B2 | 3/2004 | Kanamitsu et al. |
| 7,679,133 | B2 | 3/2010 | Son et al. |
| 7,715,235 | B2 | 5/2010 | Cernea |
| 8,238,163 | B2 | 8/2012 | Park |
| 8,248,850 | B2 | 8/2012 | Dutta et al. |
| 8,270,227 | B2 | 9/2012 | Park et al. |
| 8,289,780 | B2 | 10/2012 | Yun et al. |
| 8,553,466 | B2 | 10/2013 | Han et al. |
| 8,559,235 | B2 | 10/2013 | Yoon et al. |
| 8,654,587 | B2 | 2/2014 | Yoon et al. |
| 2007/0147120 | A1 | 6/2007 | Kim |
| 2011/0051514 | A1* | 3/2011 | Han .................... G06F 11/1048 365/185.09 |
| 2011/0233648 | A1 | 9/2011 | Seol et al. |
| 2015/0049545 | A1* | 2/2015 | Jo ...................... G11C 16/3459 365/185.03 |

FOREIGN PATENT DOCUMENTS

| JP | 2010055748 A | 3/2010 |
| KR | 100204803 B1 | 3/1999 |
| KR | 100693250 B1 | 3/2007 |
| KR | 101074564 B1 | 10/2011 |
| KR | 1020140006283 A | 1/2014 |

\* cited by examiner

*Primary Examiner* — Son Dinh
*Assistant Examiner* — Sultana Begum
(74) *Attorney, Agent, or Firm* — Volentine & Whitt, PLLC

(57) ABSTRACT

In a program operation a plurality of memory cells are programmed depending on data stored in first and second data latches. Verification read operations are performed for the plurality of memory cells using different verification voltages respectively corresponding to different program states and collecting verification read results of the verification read operations. The first data latches and the second data latches are updated depending on the collected verification read results.

20 Claims, 19 Drawing Sheets

| MSB (DL1) | 1 | 0 (1) | 0 | 1 (0) |
|---|---|---|---|---|
| LSB (DL2) | 1 | 1 (0) | 0 | 0 (1) |

FIG. 15

| | Number of bits per cell | Number of program states | Number of inhibit dump (First embodiment) | Number of inhibit dump (Second embodiment) | Reduction Ratio |
|---|---|---|---|---|---|
| Multi Level Cell (MLC) | 2 | 3 | 3 | 1 | 66.7% |
| Triple Level Cell (TLC) | 3 | 7 | 7 | 1 | 85.7% |
| Quadraple Level Cell (QLC) | 4 | 15 | 15 | 1 | 93.3% |

NONVOLATILE MEMORY AND PROGRAMMING METHOD USING THIRD LATCH FOR VERIFICATION READ RESULTS

CROSS-REFERENCE TO RELATED APPLICATIONS

A claim for priority under 35 U.S.C. §119 is made to Korean Patent Application No. 10-2014-0117793 filed Sep. 4, 2014, the subject matter of which is hereby incorporated by reference.

BACKGROUND

The inventive concept relates generally to memory devices, memory systems and methods of operating same. More particularly, the inventive concept relates to nonvolatile memory devices capable of storing multiple data bits per memory cell, memory systems incorporating such nonvolatile memory devices and methods of operating same.

Semiconductor, nonvolatile memory devices have become an important and staple component in contemporary memory systems, such as those typically used in computers, smartphones and other portable, personal electronic devices. Nonvolatile memory devices include Read Only Memory (ROM), Programmable ROM (PROM), Electrically Programmable ROM (EPROM), Electrically Erasable and Programmable ROM (EEPROM) such as flash memory, Phase-change Random Access Memory (PRAM), Magnetic RAM (MRAM), Resistive RAM (RRAM), and Ferroelectric RAM (FRAM).

With advancement in semiconductor fabrication technologies, nonvolatile memory cells are increasingly capable of storing multiple data bits. Memory cells configured to store only a single data bit are referred to as single-level memory cells or SLC, where the value of the single stored bit may be discriminated using a single verification voltage. Memory cells configured to store two data bits are referred to as multi-level memory cells or MLC, where the respective values of the two stored bits may be discriminated using three verification voltages. Memory cells configured to store three data bits are referred to as tri-level memory cells or TLC, where the respective values of the three stored bits may be discriminated using seven verification voltages, and memory cells configured to store four data bits are referred to as quad-level memory cells or QLC, where the respective values of the four stored bits may be discriminated using fifteen verification voltages.

From these examples, it is clear that as the number of data bits stored in each memory cell incrementally increases, the number of verification voltages required to discriminate between the respective data states increases exponentially, along with the number of possible data states to which the memory cell may be programmed. In addition, each data-state verification operation—that uses a corresponding verification voltage—requires the execution of a "dump operation". During a dump operation "write data" having being programmed to selected memory cell(s) of a memory cell array, and thereafter being verified for programming accuracy by a following verification operation, must be dumped from page buffer latches so that a next data-state verification operation may be performed.

The execution of multiple dump operations (e.g., potentially seven successive dump operations during programming of a TLC or fifteen successive dump operations during programming of a QLC) takes a considerable amount of time. Thus, as the number of stored bits per memory cell increases, the time required to verify programming of the memory cell increases in an exponentially related manner as more and more data states must be verified using more and more verification voltages and corresponding dump operations.

SUMMARY

One aspect of embodiments of the inventive concept is directed to provide an operating method of a nonvolatile memory which includes a plurality of memory cells respectively connected to a plurality of bit lines, first data latches respectively connected to the plurality of bit lines, and second data latches respectively connected to the plurality of bit lines. The operating method includes programming the plurality of memory cells depending on data stored at the first and second data latches; performing verification read operations for the plurality of memory cells using different verification voltages respectively corresponding to different program states and collecting verification read results of the verification read operations; and updating the first data latches and the second data latches depending on the collected verification read results. The verification read results are collected in a plurality of latches respectively corresponding to the plurality of bit lines.

The operating method may further include initializing the plurality of latches and inverting values of latches corresponding to program-inhibited memory cells of the plurality of memory cells depending on data stored at the first and second data latches after the programming and before the collecting.

The collecting may includes updating values of first latches, corresponding to memory cells having threshold voltages higher than a first verification voltage, from among the plurality of latches with a value different from an initialization value; and initializing values of the remaining latches of the first latches inverted other than latches connected to memory cells to be programmed to a program state corresponding to the first verification voltage, with the initialization value.

The collecting may further include updating values of second latches, corresponding to memory cells having threshold voltages higher than a second verification voltage, from among the plurality of latches with a value different from the initialization value; and initializing values of the remaining latches of the second latches inverted other than latches connected to memory cells to be programmed to a program state corresponding to the second verification voltage, with the initialization value.

The second verification voltage may be higher than the first verification voltage.

The collecting may further include updating values of third latches, corresponding to memory cells having threshold voltages higher than a third verification voltage, from among the plurality of latches with a value different from the initialization value.

The third verification voltage may be higher than the second verification voltage.

The verification read operations are performed while increasing a level of a verification voltage. During each verification read operation, values of latches, connected to memory cells having threshold voltages higher than the verification voltage, from among the plurality of latches may be updated with a value different from an initialization value. During each verification read operation, values of remaining latches of the updated latches other than latches connected to memory cells programmed to a program state corresponding to the verification voltage may be initialized.

The updating may include updating first data latches and second data latches connected to latches each having a value different from an initialization value such that memory cells connected to latches each having the value different from the initialization value.

The programming and the collecting may constitute one program loop. The program loop may be iterated until programming of the plurality of memory cells is passed. The plurality of latches may be set based on values of the first and second data latches updated in a first program loop. A program operation of a second program loop following the first program loop may be performed based on the set latches.

The programming and the collecting may constitute one program loop. The program loop may be iterated until programming of the plurality of memory cells is passed. A program operation of a second program loop following the first program loop may be performed based on values of latches set in a first program loop.

The operating method may further include loading, before the programming, data to be programmed at the plurality of memory cells on the first and second data latches.

The operating method may further include setting, before the programming, the plurality of latches depending on data stored at the first and second data latches. The programming is performed based on the set latches.

The programming and the collecting may constitute one program loop. The program loop may be iterated until programming of the plurality of memory cells is passed. The operating method may further includes determining, after the programming and before the collecting, whether the programming is passed or failed, based on the verification read results collected in a previous program loop.

Another aspect of embodiments of the inventive concept is directed to provide a nonvolatile memory which includes a memory cell array and a plurality of page buffers. The memory cell array includes a plurality of memory cells respectively connected to a plurality of bit lines, and the page buffers are respectively connected to the plurality of bit lines. Each of the plurality of page buffers includes a latch; and a first data latch and a second data latch connected to a bit line. During a verification read operation, latches connected to the plurality of bit lines collect verification read results of a plurality of verification read operations using different verification voltages respectively corresponding to different program states and update first data latches and second data latches corresponding to the latches depending on the collected verification read results.

The different program states may correspond to different threshold voltage distribution ranges that programmed memory cells have.

The plurality of memory cells may be programmed according to values of the latches. The verification read operation may be performed after the plurality of memory cells is programmed.

The memory cell array may include a plurality of cell strings arranged on a substrate in rows and columns Each of the plurality of cell strings may include at least one ground selection transistor, a plurality of memory cell transistors, and at least one string selection transistor stacked on the substrate along a direction perpendicular to the substrate. The plurality of memory cells may be placed at the same height from the substrate and corresponds to memory cell transistors in one row.

Still another aspect of embodiments of the inventive concept is directed to provide an operating method of a nonvolatile memory which includes a plurality of memory cells respectively connected to a plurality of bit lines, first data latches respectively connected to the plurality of bit lines, and second data latches respectively connected to the plurality of bit lines. The operating method includes programming the plurality of memory cells depending on data stored at the first and second data latches; performing a first verification read operation for the plurality of memory cells using a first verification voltage and storing a result of the first verification read operation at latches respectively corresponding to the plurality of bit lines; performing a second verification read operation for the plurality of memory cells using a second verification voltage and storing a result of the second verification read operation at the latches; and updating the first data latches and the second data latches depending on the results of the first and second verification read operations stored at the plurality of latches.

The result of the second verification read operation may be additionally stored at the plurality of latches in addition to the result of the first verification read operation.

BRIEF DESCRIPTION OF THE FIGURES

The above and other objects and features will become more apparent to those skilled in the art upon consideration of the following written description together with the drawings, in which:

FIG. 15 is a table comparing inhibit dump counts for various nonvolatile memory cells;

DETAILED DESCRIPTION

Figure 1:
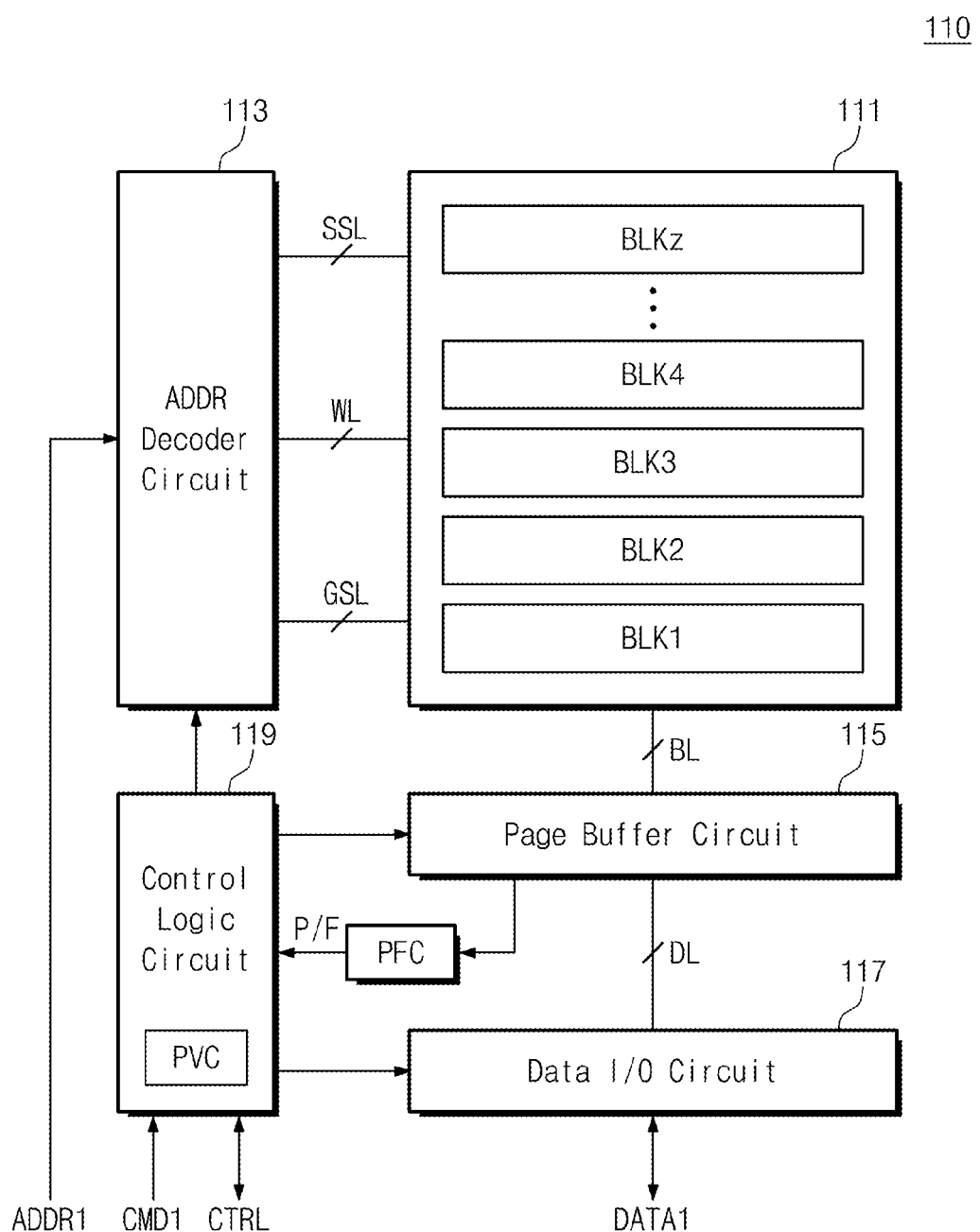
FIG. 1 is a block diagram illustrating a nonvolatile memory according to an embodiment of the inventive concept.

Embodiments of the inventive concept will now be described in some additional detail with reference to the accompanying drawings. The inventive concept may, however, be embodied in many different forms and should not be construed as being limited to only the illustrated embodiments. Rather, these embodiments are provided as examples so that this disclosure will be thorough and complete, and will fully convey the concept of the inventive concept to those skilled in the art. Unless otherwise noted, like reference numerals denote like elements throughout the attached drawings and written description.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram illustrating a nonvolatile memory 110 according to an embodiment of the inventive concept. Referring to FIG. 1, the nonvolatile memory 110 includes a memory cell array 111, an address decoder circuit 113, a page buffer circuit 115, a data input/output circuit 117, and a control logic circuit 119.

The memory cell array 111 includes a plurality of memory blocks BLK1 through BLKz, each of which has a plurality of memory cells. Each memory block is connected to the address decoder circuit 113 through at least one string selection line SSL, a plurality of word lines WL, and at least one ground selection line GSL. Each memory block is connected to the page buffer circuit 115 through a plurality of bit lines BL. The memory blocks BLK1 through BLKz may be connected in common to the plurality of bit lines BL. Memory cells of the memory blocks BLK1 through BLKz may have the same structure. In certain embodiments of the inventive concept, each of the memory blocks BLK1 through BLKz is erased during an erase operation as a unit. Thus, an erase operation may be carried out on a memory block by memory block basis, where the memory cells of a memory block are erased during a given time period. In other embodiments of the inventive concept, each memory block is functionally divided into a plurality of sub-blocks, where an erase operation is performed on a sub-block by sub-block basis.

The address decoder circuit 113 is connected to the memory cell array 111 through a plurality of ground selection lines GSL, the plurality of word lines WL, and a plurality of string selection lines SSL. The address decoder circuit 113 operates in response to a control of the control logic circuit 119. The address decoder circuit 113 receives a first address ADDR1 from an external device (e.g., memory controller). The address decoder circuit 113 decodes the first address ADDR1 and controls voltages to be applied to the word lines WL depending on the decoded address.

For example, during a program operation, the address decoder circuit 113 applies a program voltage to a selected word line of a selected memory block as indicated by the first address ADDR1. The address decoder circuit 113 also applies a pass voltage to unselected word lines of the selected memory block. During a read operation, the address decoder circuit 113 applies a selection read voltage to a selected word line of a selected memory block as indicated by the first address ADDR1. The address decoder circuit 113 also applies a non-selection read voltage to unselected word lines of the selected memory block. During an erase operation, the address decoder circuit 113 applies an erase voltage (e.g., ground voltage) to word lines of a selected memory block as indicated by the first address ADDR1.

The page buffer circuit 115 is connected to the memory cell array 111 through the bit lines BL. The page buffer circuit 115 is connected to the data input/output circuit 117 through a plurality of data lines DL. The page buffer circuit 115 operates in response to a control of the control logic circuit 119.

The page buffer circuit 115 may be used to hold (i.e., temporarily store) "write data" to be programmed to selected memory cells of the memory cell array 111 during a program operation, or to hold "read data" retrieved from selected memory cells of the memory cell array 111 during a read operation. Thus, during a program operation, the page buffer circuit 115 stores write data being programmed to selected memory cells, where the page buffer circuit 115 correspondingly biases the plurality of bit lines BL based on the stored write data. In this manner, the page buffer circuit 115 functions as a write driver during program operations. During a read operation, the page buffer circuit 115 senses voltages of the bit lines BL and stores the sensed results. In this manner, the page buffer circuit 115 functions as a sense amplifier during read operations.

The data input/output (I/O) circuit 117 is connected to the page buffer circuit 115 via the data lines DL. The data I/O circuit 117 is configured to receive write data from or communicate read data to (respectively, referred to as first data DATA1) an external device, such as a memory controller. Thus, the data I/O circuit 117 temporarily stores first data DATA1 received from the memory controller 120 and thereafter transfers the temporarily stored first data DATA1 to the page buffer circuit 115. Analogously, the data I/O circuit 117 temporarily stores the first data DATA1 received from the page buffer circuit 115 and then communicates it to the memory controller 120. In this manner, the data I/O circuit 117 functions as a buffer memory.

The control logic circuit 119 receives a first command CMD1 and one or more control signal(s) CTRL from the memory controller 120. The control logic circuit 119 decodes the first command CMD1 thus received and controls an overall operation of the nonvolatile memory 110 according to the decoded command.

The control logic circuit 119 includes a program verification circuit PVC. The program verification circuit PVC controls execution of variously defined "verification operations" (or "verification read operations") directed to the memory cells of the nonvolatile memory 110 during the programming of the memory cells. This will be described in some additional detail hereafter.

A pass/fail check circuit PFC outputs a pass signal P or a fail signal F to the control logic circuit 119 depending on a "verification read result" collected in the page buffer circuit 115 as the result of an executed verification read operation. Thus, when a verification read result indicates program pass, the pass/fail check circuit PFC outputs the pass signal P, and when the verification read result indicates program fail, the pass/fail check circuit PFC outputs the fail signal F.

Figure 2:
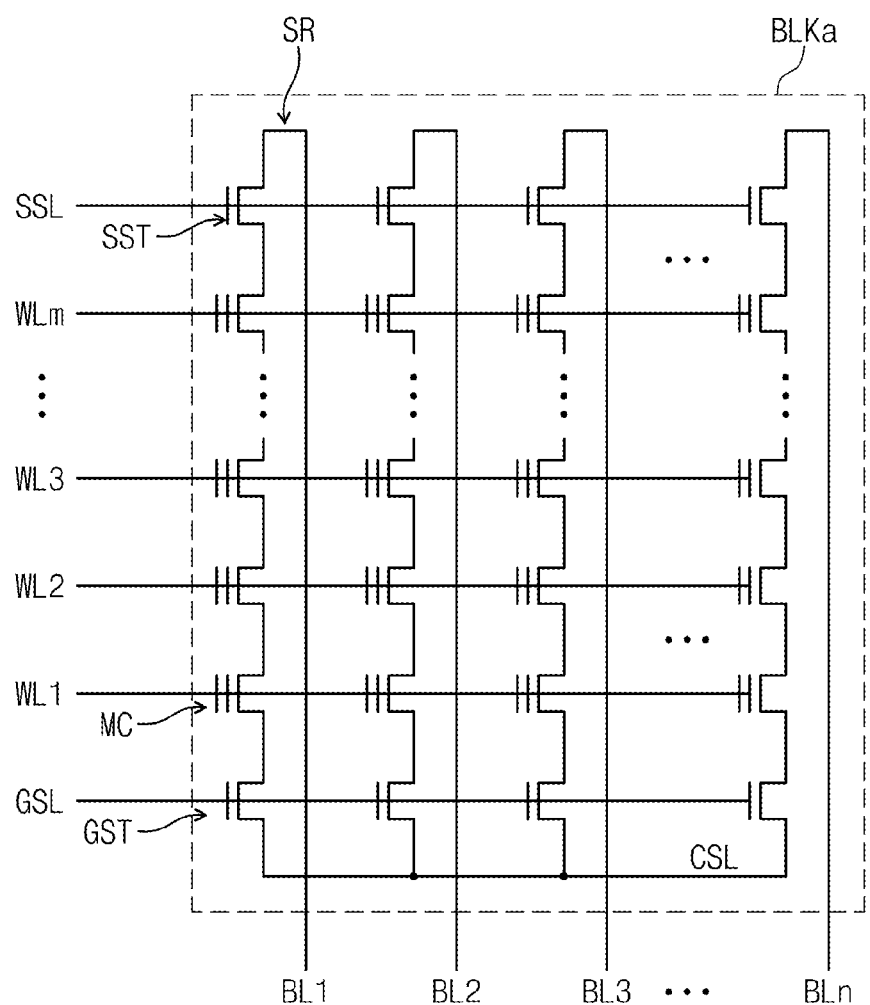
FIG. 2 is a circuit diagram illustrating in part an exemplary memory block that may be defined in the memory cell array 111 of FIG. 1.

FIG. 2 is a circuit diagram illustrating one possible memory block BLKa arrangement that may be used in the memory cell array 111 of FIG. 1. Referring to FIGS. 1 and 2, the memory block BLKa includes a plurality of strings SR respectively connected to bit lines BL1 through BLn. Each string SR contains a ground selection transistor GST, memory cells MC, and a string selection transistor SST, where the ground selection transistor GST is connected between the memory cells MC and a common source line CSL and the ground selection transistors GST of the strings SR are commonly connected to the common source line CSL. In each string SR, the string selection transistor SST is connected between the memory cells MC and a bit line BL, where the string selection transistors SST of the strings SR are respectively connected to the bit lines BL1 through BLn.

In each string SR, a plurality of memory cells MC is connected between the ground selection transistor GST and the string selection transistor SST. In each string SR, the plurality of memory cells MC are connected in series. Memory cells MC having the same "height" from the common source line CSL are commonly connected to a word line, and memory cells MC are connected to a word lines WL1 through WLm.

The programming and reading of memory cells MC may be accomplished by selectively applying control voltages to one or more of the word lines WL1 through WLm. Thus, memory cells MC commonly connected to a word line may be simultaneously programmed or read.

As noted above, memory cells MC may be erased by the memory block. Thus, memory cells MC of the memory block BLKa may be erased at the same time. Alternately, memory cells MC may be erased by the sub-block, where the memory block BLKa is divided into sub-blocks and memory cells MC in each of the sub-block are simultaneously erased.

Figures 3A, 3B:
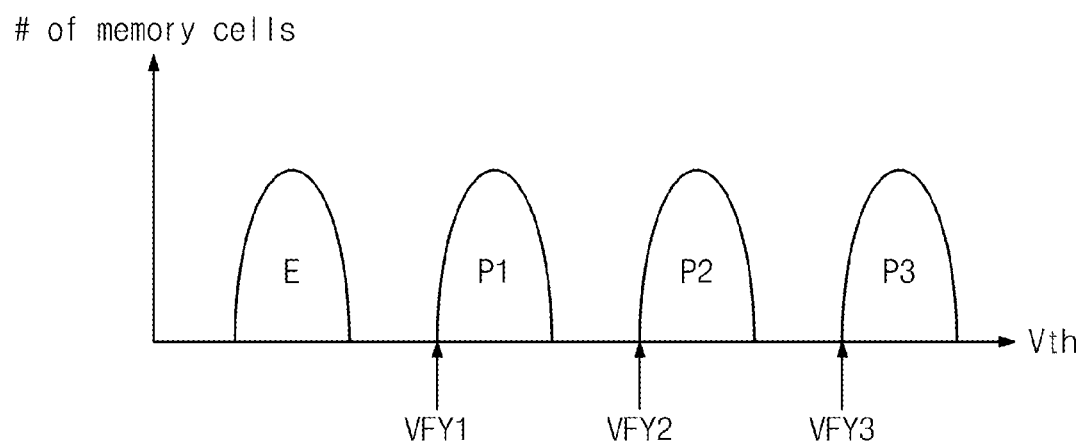
FIG. 3, inclusive of FIGS. 3A and 3B, illustrates threshold voltage distributions and corresponding data states that may be used in relation to MLC.

FIG. 3, inclusive of FIGS. 3A and 3B, illustrates threshold voltage distributions and corresponding data states that may be used to program a 2-bit MLC. In FIG. 3A, the abscissa indicates a threshold voltage Vth, and the ordinate indicates a number of memory cells MC. An erase state (E) voltage distribution, and first through third program state (P1, P2 and P3) voltage distribution are provided at increasing voltage levels in this example. As indicated by the table of FIG. 3B, 2-bit data may be stored in a MLC as a least significant bit (LSB) and a most significant bit (MSB).

When the LSB and MSB programmed to a MLC are both "1", the MLC will indicate the erase state (E). When LSB and MSB are respectively programmed as "1" and "0" (or "0" and "1"), the MLC is programmed to the first program state P1. Thus, the MLC programmed to the first program state P1 will have a threshold voltage higher than a first verification voltage VFY1, where the MLC is program-inhibited when its threshold voltage is higher than the first verification voltage VFY1.

When LSB and MSB programmed to a MLC are "0" and "0", the MLC is programmed to the second program state P2. Upon programming, the MLC corresponding to the second program state P2 (e.g., to be programmed to the second program state P2) is programmed to have a threshold voltage higher than a second verification voltage VFY2. The MLC is program-inhibited when a threshold voltage of the memory cell MC corresponding to the second program state P2 becomes higher than the second verification voltage VFY2.

When LSB and MSB programmed to a MLC are "0" and "1" (or "1" and "0"), the MLC is programmed to the third program state P3. Upon programming, the MLC corresponding to the third program state P3 (e.g., to be programmed to the third program state P3) is programmed to have a threshold voltage higher than a third verification voltage VFY3. The MLC is program-inhibited when a threshold voltage of the MLC corresponding to the third program state P3 becomes higher than the third verification voltage VFY3.

It will be understood by those skilled in the art that the embodiment illustrated in FIG. 3 is merely one example of many different ways in which data states and threshold voltage distributions may be defined for a 2-bit MLC.

Figure 4:
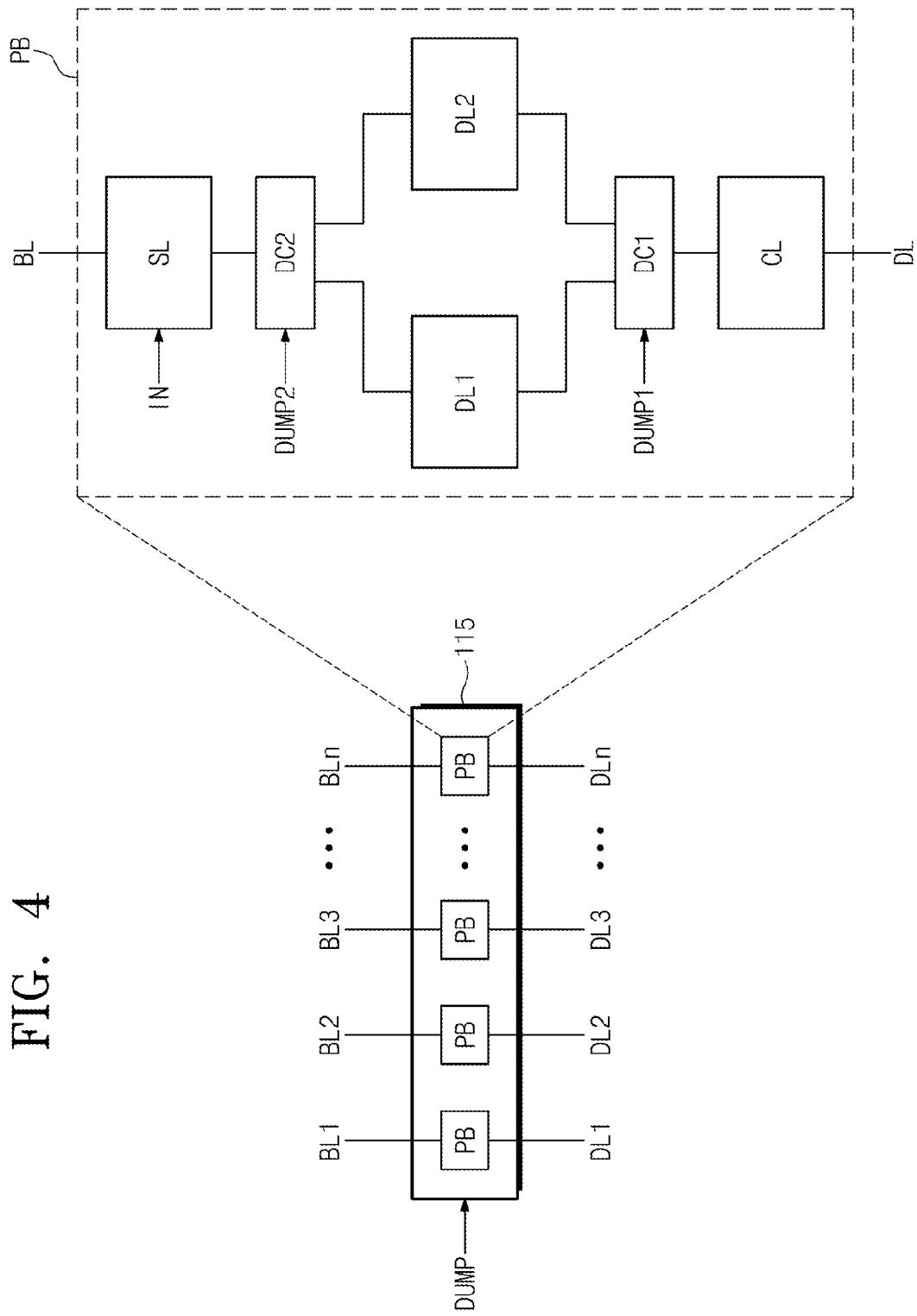
FIG. 4 is a block diagram illustrating in one example a page buffer circuit that may be used in certain embodiments of the inventive concept.

FIG. 4 is a block diagram illustrating in one example the page buffer circuit 115 of FIG. 1 according to certain embodiments of the inventive concept. Referring to FIGS. 1, 2, 3 and 4, the page buffer circuit 115 includes a plurality of page buffers PB, where each page buffer PB is respectively connected between one of a plurality of bit lines BL1 through BLn and one of a plurality of data lines DL1 through DLn. Further each page buffer PB receives a dump signal DUMP from a control logic circuit 119, or a dump signal DUMP derived from a dump signal received from the control logic 119.

In the illustrated example of FIG. 4, each page buffer PB includes a cache latch CL, at least two (first and second) data latches DL1 and DL2, a sense latch SL, a first dump circuit DC1, and a second dump circuit DC2. Thus, the example illustrated in FIG. 4 is consistent with the 2-bit MLC example illustrated in FIG. 3 that presumes that a page buffer PB will include first and second data latches DL1 and DL2. However, the scope of the inventive concept may not be limited to only these working examples. That is, each page buffer PB may include a number of data latches equal to the number of data bits being stored in each nonvolatile memory cell of the memory cell array 111. For brevity of description, it is assumed that a page buffer PB includes two data latches DL1 and DL2 and that 2-bit data is being stored in a MLC, but the scope of the inventive concept may not be limited thereto.

The cache latch CL is connected with a data line DL. The cache latch CL receives data through the data line DL or outputs data through the data line DL.

The cache latch CL is connected with the first and second data latches DL1 and DL2 through the first dump circuit DC1. The first dump circuit DC1 receives first dump signal DUMP1. The first dump circuit DC1 dumps data (e.g., MSB) stored at the cache latch CL into the first data latch DL1 in response to the first dump signal DUMP1 (or at least a portion or pattern of the first dump signal DUMP1). The first dump circuit DC1 dumps data (e.g., LSB) stored at the cache latch CL into the second data latch DL2 in response to the first dump signal DUMP1 (or at least another portion or pattern of the first dump signal DUMP1). For example, when a program operation is executed, the first dump circuit DC1 dumps MSB and LSB to be programmed at a memory cell to the first data latch DL1 and the second data latch DL2 respectively.

The sense latch SL is connected with the bit line BL. Upon programming, the sense latch SL is set through the second dump circuit DC2. The sense latch SL biases the bit line BL with a predetermined value.

The sense latch SL performs sensing during a verification read operation. For example, the sense latch SL supplies a power supply voltage VCC to the bit line BL. The sense latch SL is initialized in response to an initialization signal IN. For example, the sense latch SL is initialized to have a value of "0" (or, "1"). The sense latch SL is updated depending on a voltage level of the bit line BL or the amount of current flowing through the bit line BL. For example, when a voltage level of the bit line BL is lower than a first threshold value or when the amount of current flowing through the bit line BL is greater than a second threshold value, the sense latch SL is inverted to have a value of "1" (or, "0"). Thus, the sense latch SL may be inverted, for example, when a threshold voltage of a to-be-verified MLC connected with the bit line BL and a selected word line WL is higher than a verification voltage applied to the selected word line WL. Or the sense latch SL may be inverted, for example, when a verification read result for the to-be-verified MLC indicates "pass". The sense latch SL holds a value stored therein when a voltage level of the bit line BL is higher than the first threshold value or when the amount of current flowing through the bit line BL is lower than the second threshold value. The sense latch SL holds a value stored therein when a threshold voltage of the to-be-verified MLC is lower than the verification voltage applied to the selected word line WL, for example. The sense latch SL holds a value stored therein, for example, when a verification read result for the to-be-verified MLC indicates "fail".

The sense latch SL is connected to the first and second data latches DL1 and DL2 through the second dump circuit DC2. The second dump circuit DC2 receives second dump signal DUMP2.

During a program operation, the second dump circuit DC2 sets the sense latch SL. In response to the second dump signal DUMP2, the second dump circuit DC2 combines values of the first and second data latches DL1 and DL2 and dumps the combined result to the sense latch SL. In response to the second dump signal DUMP2, the second dump circuit DC2 sets a value of the sense latch SL depending on values stored at the first and second data latches DL1 and DL2. When values stored at the first and second data latches DL1 and DL2 mean program-inhibition, for example, when values stored at the first and second data latches DL1 and DL2 indicates an erase state E, a value of the sense latch SL is set to have a value of "1" (or, "0"). The second dump circuit DC2 sets the sense latch SL such that a MLC connected with the bit line BL and the selected word line WL is not programmed. When values stored at the first and second data latches DL1 and DL2 does not mean program-inhibition, for example, when values stored at the first and second data latches DL1 and DL2 indicates one of first through third program states P1 through P3, a value of the sense latch SL is set with "0" (or, "1"). The second dump circuit DC2 sets the sense latch SL such that the MLC connected with the bit line BL and the selected word line WL is programmed.

During a verification read operation, the second dump circuit DC2 performs selection dump. For example, the second dump circuit DC2 sets the sense latch SL. In response to the second dump signal DUMP2 (or at least a portion or pattern of the second dump signal DUMP2), the second dump circuit DC2 sets a value of the sense latch SL depending on values stored at the first and second data latches DL1 and DL2.

For example, during a verification read operation associated with the first program state P1 having the lowest threshold voltage range, the second dump circuit DC2 performs the selection dump for the first program state P1. During the verification read operation for the first program state P1, the second dump circuit DC2 sets the sense latch SL with "0" (or, "1") when values stored at the first and second data latches DL1 and DL2 indicates a second program state P2 or a third program state P3 having a threshold voltage range higher than the first program state P1. For example, the second dump circuit DC2 sets the sense latch SL corresponding to the second or third program state P2 or P3 such that the verification read result indicates "fail".

During a verification read operation for the second program state P2 having the second threshold voltage range, the second dump circuit DC2 performs the selection dump for the second program state P2. During the verification read operation for the second program state P2, the second dump circuit DC2 sets the sense latch SL with "0" (or, "1") when values stored at the first and second data latches DL1 and DL2 indicates the third program state P3 having a threshold voltage range higher than the second program state P2. For example, the second dump circuit DC2 sets the sense latch SL corresponding to the third program state P3 such that the verification read result indicates "fail".

During a verification read operation for the third program state P3 having the highest threshold voltage range, the second dump circuit DC2 does not perform the selection dump.

The second dump circuit DC2 performs inhibit dump during the verification read operation. For example, the second dump circuit DC2 updates the first and second data latches DL1 and DL2 depending on the second dump signal DUMP2 (or at least another portion or pattern of the second dump signal DUMP2) and the verification read result stored at the sense latch SL. When the verification read result stored at the sense latch SL indicates "1" (or, "0"), for example, program pass, the second dump circuit DC2 updates the first and second data latches DL1 and DL2 so as to indicate program inhibition, for example, the erase state E. When the verification read result stored at the sense latch SL indicates "0" (or, "1"), for example, program fail, the second dump circuit DC2 does not update the first and second data latches DL1 and DL2. That is, when programming of the MLC is passed, the second dump circuit DC2 updates the first and second data latches DL1 and DL2 depending on the verification read result such that the MLC is program-inhibited.

Figure 5:
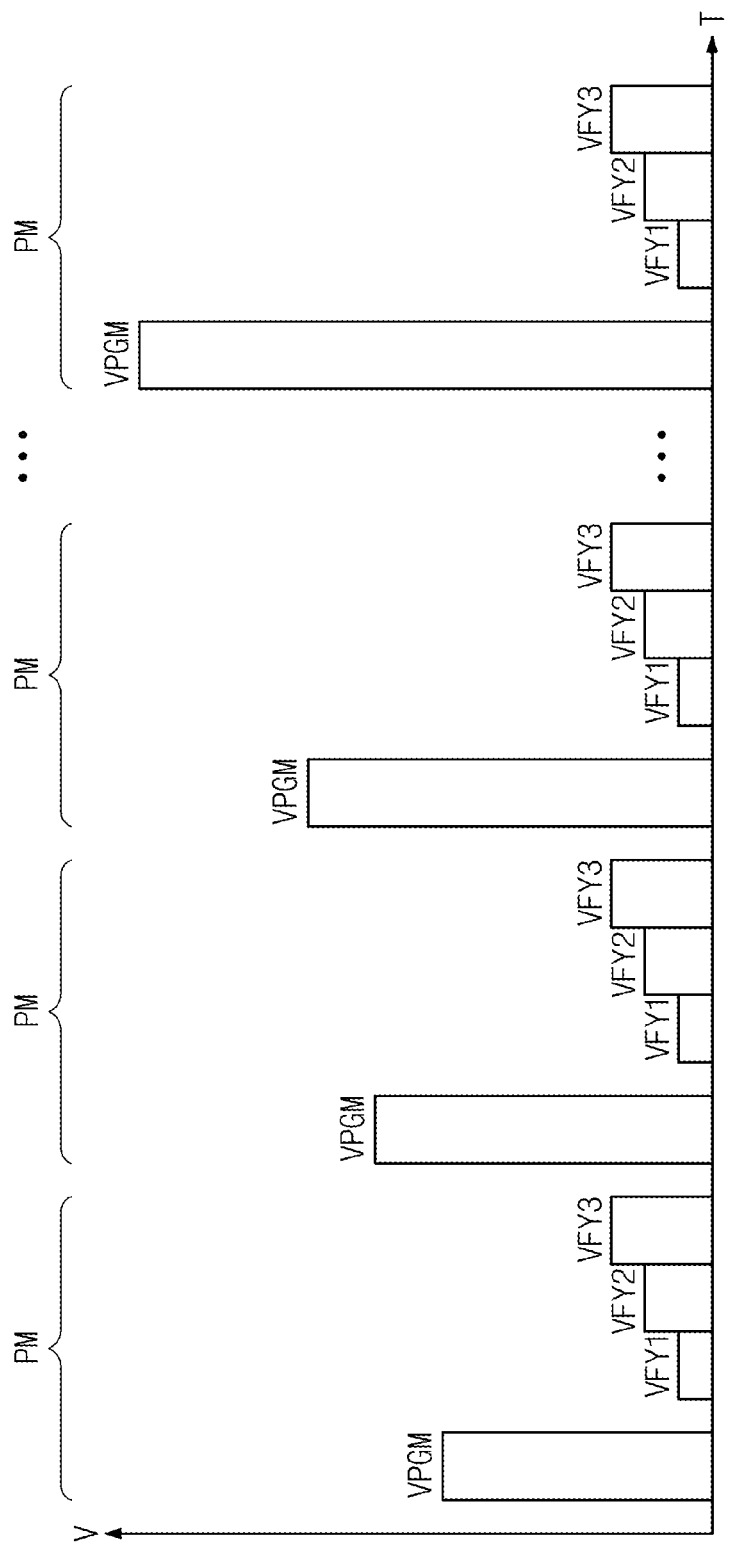
FIG. 5 is a timing diagram illustrating one exemplary approach to the programming of a MLC that may be used in certain embodiments of the inventive concept.

FIG. 5 is a timing diagram illustrating one approach that may be taken to the execution of a program operation according to certain embodiments of the inventive concept. In FIG. 5, the abscissa indicates time (T), and the ordinate indicates a voltage level (V).

Referring to FIGS. 1 through 5, MLC are iteratively programmed through a number of program loops PM. Each program loop PM includes a program operation where a program voltage VPGM is applied to a word line WL (e.g., selected word line) connected with selected MLC to be programmed, a first verification read operation where a first verification voltage VFY1 is applied to the selected word line WL, a second verification read operation where a second verification voltage VFY2 is applied to the selected word line WL, and a third verification read operation where a third verification voltage VFY3 is applied to the selected word line WL.

The program loop PM is repeated until programming of the MLC is passed. The level of the program voltage VPGM in the illustrated example of FIG. 5 increases when the program loop PM is iterated.

Upon each iteration of the program loop PM, the verification read operation for a program-passed program state is skipped when memory cells corresponding to the particular program state are program-passed. For example, when MLC verified using the first verification voltage VFY1 are program-passed, the first verification read operation is skipped, but the second and third verification read operations may be executed. That is, the first verification voltage VFY1 is not applied in the program loop PM.

Figure 6:
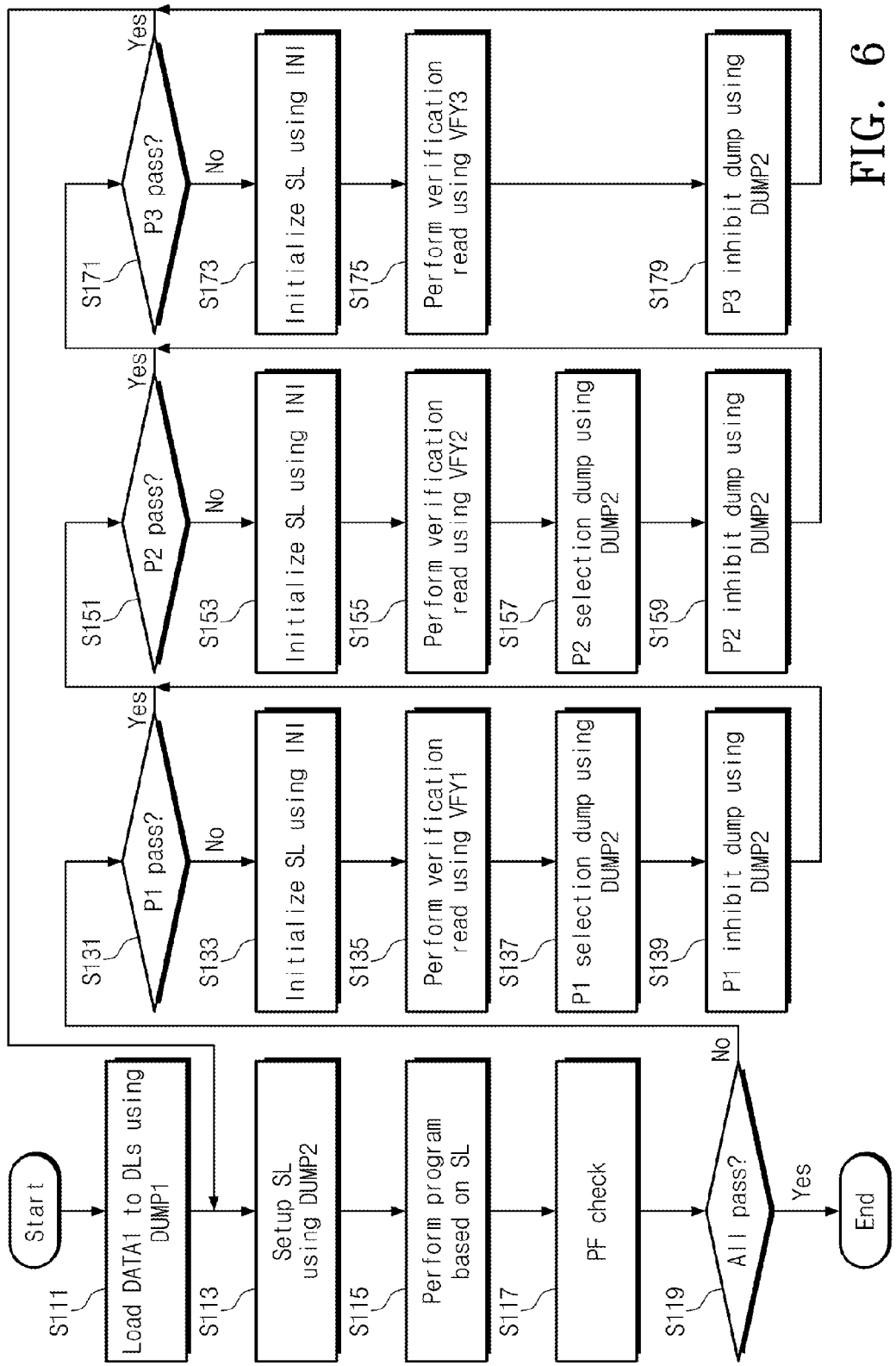
FIGS. 6, 7, 8 and 9 are respective flowcharts variously summarizing methods of executing a program operation according to embodiments of the inventive concept.

FIG. 6 is a flow chart summarizing a method of executing a program operation according to an embodiment of the inventive concept. Referring to FIGS. 1, 2, 3, 4, 5 and 6, in step S111, first data DATA1 to be programmed to MLC connected with a selected word line is loaded on data latches DL using first dump signal DUMP1. For example, MSB data of the first data DATA1 is loaded on first data latches DL1 of page buffers PB in response to the first dump signal DUMP1, and LSB data of the first data DATA1 is loaded on second data latches DL2 of the page buffers PB in response to the first dump signal DUMP1.

In step S113, sense latches SL are set using second dump signal DUMP2. For example, in each page buffer PB, when values of the first and second data latches DL1 and DL2 indicate an erase state E, the sense latch SL is set to indicate program inhibition. For example, the sense latch SL may be set with "1". In each page buffer PB, when values of the first and second data latches DL1 and DL2 indicate one of first through third program states P1 through P3, the sense latch SL is set to indicate program. For example, the sense latch SL may be set with "0".

In step S115, programming is executed based on the sense latches SL. For example, bit lines BL1 through BLn are biased according to values set in the sense latches SL. A power supply voltage VCC is applied to a bit line BL that is connected with a sense latch SL having a value of "1". A ground voltage VSS is applied to a bit line BL that is connected with a sense latch SL having a value of "0". A program voltage VPGM is applied to the selected word line.

In step S117, whether programming of the MLC is passed or failed is determined. For example, program pass or fail may be determined according to results of verification read operations executed in a previous program loop. Step S117 may be skipped when a previous program loop does not exist, that is, in a first program loop.

Programming of the first program state P1 is determined to be passed when the number of MLC having threshold voltages lower than the first verification voltage VFY1 from among the MLC programmed to the first program state P1 is less than or equal to a first critical value. Programming of the first program state P1 is determined to be failed when the number of MLC having threshold voltages lower than the first verification voltage VFY1 from among MLC programmed to the first program state P1 is greater than the first critical value.

Programming of the second program state P2 is determined to be passed when the number of MLC having threshold voltages lower than the second verification voltage VFY2 from among MLC programmed to the second program state P2 is less than or equal to a second critical value. Programming of the second program state P2 is determined to be failed when the number of MLC having threshold voltages lower than the second verification voltage VFY2 from among MLC programmed to the second program state P2 is greater than the second critical value.

Programming of the third program state P3 is determined to be passed when the number of MLC having threshold voltages lower than the third verification voltage VFY3 from among MLC programmed to the third program state P3 is less than or equal to a third critical value. Programming of the third program state P3 is determined to be failed when the number of MLC having threshold voltages lower than the third verification voltage VFY3 from among MLC programmed to the third program state P3 is greater than the third critical value.

In step S119, a determination is made as to whether programming for all program states P1 through P3 is passed. If so, the method ends. If not, verification read operations are executed.

In step S131, a determination is made as to whether programming of the first program state P1 is passed. If so, a verification read operation for the first program state P1 is skipped, and then the method proceeds to step S151. If not, steps S133 through S139 are executed for the verification read operation for the first program state P1.

In step S133, sense latches SL are initialized using an initialization signal IN. For example, values of the sense latches SL are initialized with "0" (or, "1").

In step S135, the verification read operation is performed using the first verification voltage VFY1. For example, the bit lines BL1 through BLn are charged with the power supply voltage VCC. The first verification voltage VFY1 is applied to the selected word line WL. The sense latches SL latches voltages of the bit lines BL1 through BLn.

For example, when a threshold voltage of a first MLC is higher than the first verification voltage VFY1, the first MLC is turned OFF. A first bit line BL1 connected with the first MLC holds the power supply voltage VCC. A first sense latch SL1 connected with the first bit line BL1 is updated with "1".

When a threshold voltage of a second MLC is lower than the first verification voltage VFY1, the second MLC is turned ON. A voltage of a second bit line BL2 connected with the second MLC decreases to a ground voltage VSS. A second sense latch SL2 connected with the second bit line BL2 is updated with "0".

In step S137, selection dump for the first program state P1 is performed using second dump signal DUMP2. A threshold voltage distribution range of the second program state P2 is higher than that of the first program state P1. When MLC to be programmed to the second program state P2 are determined to be passed by the first verification voltage VFY1, threshold voltages of the MLC not having a threshold voltage in the threshold voltage distribution range of the second program state P2 belong to the threshold voltage distribution range of the first program state P1. Thus, the pass or fail determination for MLC to be programmed to the second program state P2 does not have to be determined by the first verification voltage VFY1. Likewise, the pass or fail determination for MLC to be programmed to a third program state P3 does not have to be determined by the first verification voltage VFY1.

In a page buffer PB where values of first and second data latches DL1 and DL2 indicate the second program state P2 or the third program state P3, a value of the sense latch SL is set with "0" (or, "1") in response to the second dump signal DUMP2. That is, MLC to be programmed to the second program state P2 or the third program state P3 are managed as not being passed by the first verification voltage VFY1. In MLC to be programmed to the second or third program state P2 or P3, a result of the verification read operation executed using the first verification voltage VFY1 is ignored. That is, only results of the verification read operations for MLC to be programmed to the first program state P1 are selected.

In step S139, inhibit dump for the first program state P1 is performed using the second dump signal DUMP2. For example, in each page buffer PB, when a value of the sense latch SL is "1", the first and second data latches DL1 and DL2 are updated to indicate an erase state E. That is, the first and second data latches DL1 and DL2 of a memory cell, having a threshold voltage higher than the first verification voltage VFY1, from among MLC to be programmed to the first program state P1 are updated to indicate the erase state E. Programming during subsequent program loop(s) PM is inhibited when the first and second data latches DL1 and DL2 are updated to indicate the erase state E.

In step S151, a determination is made as to whether programming of the second program state P2 is passed. If so, a verification read operation for the second program state P2 is skipped, and then the method proceeds to step S171. If not, steps S153 through S159 are executed for the verification read operation for the second program state P2.

In step S153, the sense latches SL are initialized using the initialization signal INI. For example, values of the sense latches SL are initialized with "0" (or, "1").

In step S155, the verification read operation is performed using the second verification voltage VFY2. For example, when a threshold voltage of a first MLC is higher than the second verification voltage VFY2, the first MLC is turned OFF. The first sense latch SL1 connected with the first MLC is updated with a value of "1". When a threshold voltage of a second MLC is lower than the second verification voltage VFY2, the second MLC is turned ON. The second sense latch SL2 connected with the second memory cell MC2 holds a value of "0".

In step S157, selection dump for the second program state P2 is performed using the second dump signal DUMP2. A threshold voltage distribution range of the third program state P3 is higher than that of the second program state P2. When MLC to be programmed to the third program state P3 are determined to be passed by the second verification voltage VFY2, threshold voltages of the MLC that do not fall within the threshold voltage distribution range of the third program state P3 belong to the threshold voltage distribution range of the second program state P2. Thus, a pass or fail determination for MLC to be programmed to the third program state P3 does not depend on the second verification voltage VFY2.

In a page buffer PB where values of first and second data latches DL1 and DL2 indicate the third program state P3, a value of the sense latch SL is set with "0" (or, "1") in response to the second dump signal DUMP2. That is, MLC to be programmed to the third program state P3 are managed as not being passed by the second verification voltage VFY2. In MLC to be programmed to the third program state P3, a result of the verification read operation executed using the second verification voltage VFY2 is ignored. That is, results of the verification read operations for MLC to be programmed to the second program state P2 are selected.

In step S159, inhibit dump for the second program state P2 is performed using the second dump signal DUMP2. For example, in each page buffer PB, when a value of the sense latch SL is "1", the first and second data latches DL1 and DL2 are updated to indicate an erase state E. That is, the first and second data latches DL1 and DL2 of a memory cell, having a threshold voltage higher than the second verification voltage VFY2, from among MLC to be programmed to the second program state P2 are updated to indicate the erase state E. Programming in a following program loop PM is inhibited when the first and second data latches DL1 and DL2 are updated to indicate the erase state E.

In step S171, a determination is made as to whether programming of the third program state P3 is passed. If so, a verification read operation for the third program state P3 is skipped, and the method proceeds to step S113. If not, steps S173 through S179 are executed for the verification read operation for the third program state P3.

In step S173, sense latches SL are initialized using an initialization signal INI. For example, values of the sense latches SL are initialized with "0" (or, "1").

In step S175, the verification read operation is performed using the third verification voltage VFY3. For example, when a threshold voltage of a first MLC is higher than the third verification voltage VFY3, the first MLC is turned OFF. The first sense latch SL1 connected with the first memory cell MC1 is updated with a value of "1". When a threshold voltage of a second MLC is lower than the third verification voltage VFY3, the second MLC is turned ON. The second sense latch SL2 connected with the second memory cell MC2 holds a value of "0".

A program state having a threshold voltage distribution range higher than that of the third program state P3 does not exist. Thus, the selection dump is not performed during the verification read operation for the third program state P3.

In step S179, inhibit dump for the third program state P3 is performed using the second dump signal DUMP2. For example, in each page buffer PB, when a value of the sense latch SL is "1", the first and second data latches DL1 and DL2 are updated to indicate an erase state E. That is, the first and second data latches DL1 and DL2 of a memory cell, having a threshold voltage higher than the third verification voltage VFY3, from among MLC to be programmed to the third program state P3 are updated to indicate the erase state E. Programming in a following program loop PM is inhibited when the first and second data latches DL1 and DL2 are updated to indicate the erase state E.

After step S179, a next program loop PM may be executed from step S113.

As described with reference to FIG. 6, multiple dump operations during a program loop PM may be executed. For example, when nonvolatile memory cells are programmed to have first through N-th program states (N being a positive integer greater than 2), one program loop may contain a one program dump operation dumping data in the first and second data latches DL1 and DL2 to the sense latches SL (S113), (N–1) selection dump operations, and N inhibit dump operations. That is, one program loop PM includes 2N dump operations.

Figure 7:
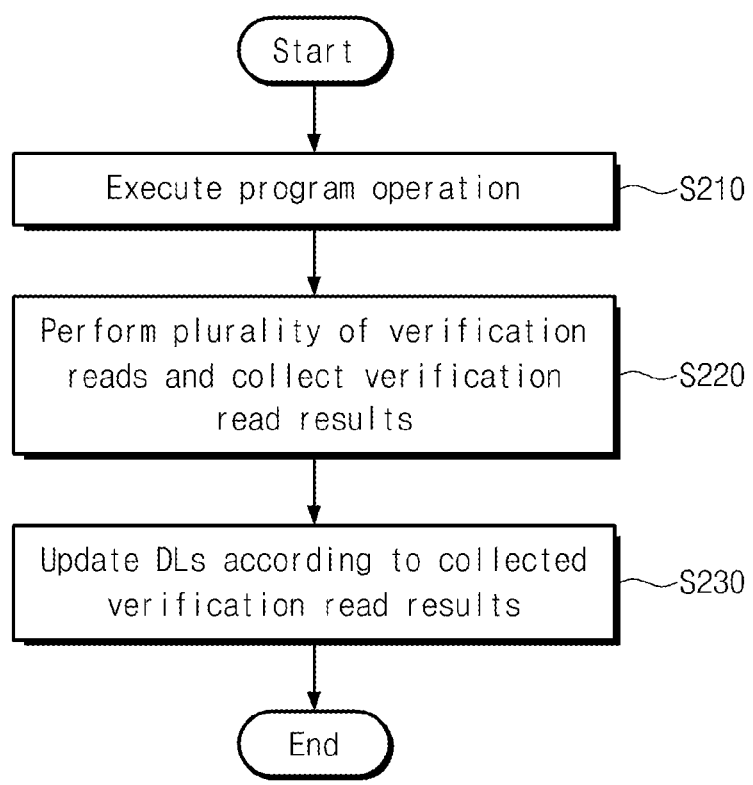

FIG. 7 is a flowchart summarizing a method of performing a program operation according to another embodiment of the inventive concept. Referring to FIGS. 1, 2, 3, 4 and 7, in step S210, a program operation is executed. In step S220, a plurality of verification read operations is performed and results of the verification read operations are collected. For example, verification read operations may be performed with respect to different program states having different threshold voltage ranges. Results of the verification read operations for different program states are collected. In step S230, data latches DL are updated according to the collected results of the verification read operations.

Assuming a program operation like the one described with reference to FIG. 6, inhibit dump is performed to dump a result of the verification read operation to data latches DL whenever the verification read operation is performed. According to a program operation described with reference to FIG. 7, verification read results corresponding to different program states are collected, and the collected verification read results are applied to data latches DL, thereby making it possible to reduce the number of inhibit dump operations when one program loop PM is performed. This means that operating speed of a nonvolatile memory 110 of FIG. 1 may be improved.

Figure 8:
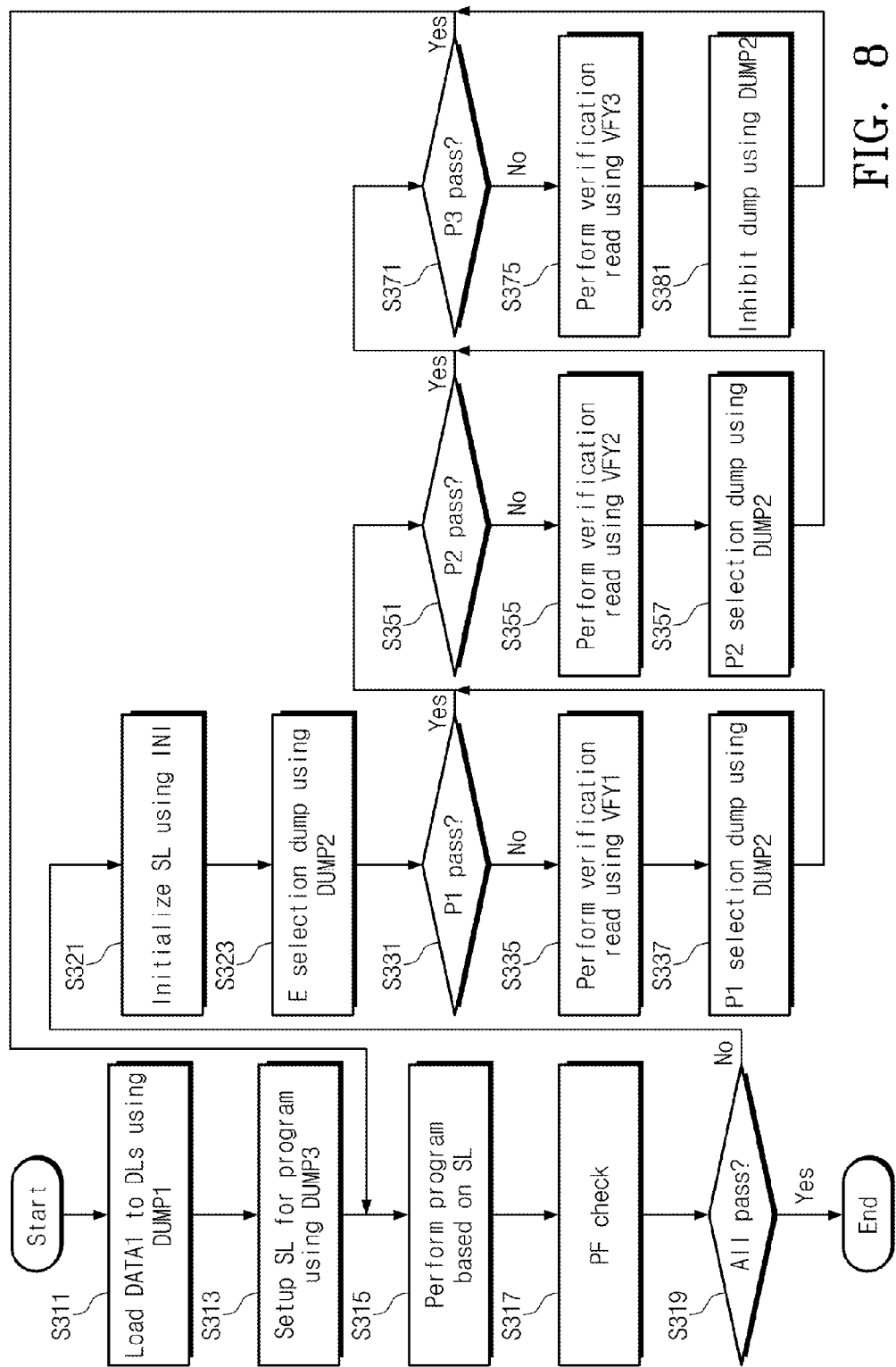

FIG. 8 is a flowchart summarizing in some additional detail the method of executing a program operation described in relation to FIG. 7. Referring to FIGS. 1, 2, 3, 4 and 8, in step S131, first data DATA1 to be programmed to MLC connected with a selected word line is loaded on data latches DL using first dump signal DUMP1. For example, MSB data of the first data DATA1 is loaded on first data latches DL1 of page buffers PB in response to the first dump signal DUMP1, and LSB data of the first data DATA1 is loaded on second data latches DL2 of the page buffers PB in response to the first dump signal DUMP1.

In step S313, sense latches SL are set using second dump signal DUMP2. For example, in each page buffer PB, when values of the first and second data latches DL1 and DL2 indicate an erase state E, the sense latch SL is set to indicate program inhibition. For example, the sense latch SL may be set with "1". In each page buffer PB, when values of the first and second data latches DL1 and DL2 indicate one of first through third program states P1 through P3, the sense latch SL is set to indicate program execution. For example, the sense latch SL may be set with "0".

In step S315, programming is executed based on the sense latches SL. For example, bit lines BL1 through BLn are biased according to values set in the sense latches SL. A power supply voltage VCC is applied to a bit line BL that is connected with a sense latch SL having a value of "1". A ground voltage VSS is applied to a bit line BL that is connected with a sense latch SL having a value of "0". A program voltage VPGM is applied to the selected word line.

In step S317, a determination is made as to whether programming of the MLC is passed or failed. For example, program pass or fail may be determined according to results of verification read operations executed in a previous program loop. Step S317 may be skipped when a previous program loop does not exist, that is, in a first program loop.

A determination is made that programming of the first program state P1 is passed when the number of MLC having threshold voltages lower than the first verification voltage VFY1 from among MLC programmed to the first program state P1 is less than or equal to a first critical value. Programming of the first program state P1 is determined to be failed when the number of MLC having threshold voltages lower than the first verification voltage VFY1 from among MLC programmed to the first program state P1 is greater than the first critical value.

Programming of the second program state P2 is determined to be passed when the number of MLC having threshold voltages lower than the second verification voltage VFY2 from among MLC programmed to the second program state P2 is smaller or equal to a second critical value. Programming of the second program state P2 is determined to be failed when the number of MLC having threshold voltages lower than the second verification voltage VFY2 from among MLC programmed to the second program state P2 is greater than the second critical value.

Programming of the third program state P3 is determined to be passed when the number of MLC having threshold voltages lower than the third verification voltage VFY3 from among MLC programmed to the third program state P3 is less than or equal to a third critical value. Programming of the third program state P3 is determined to be failed when the number MLC having threshold voltages lower than the third verification voltage VFY3 from among MLC programmed to the third program state P3 is greater than the third critical value.

In step S319, determinations are made as to whether programming of all program states P1, P2 and P3 are passed. If so, the method ends. If not, verification read operations are executed.

In step S321, sense latches SL are initialized using an initialization signal INI. For example, the sense latches SL are set with a value (refer to step S313) indicating program execution. For example, the sense latches SL are initialized to have a value of "0" (or, "1").

In step S323, selection dump for the erase state E is performed using second dump signal DUMP2. For example, in each page buffer PB, when values of the first and second data latches DL1 and DL2 indicates program inhibition, for example, the erase state E, a second dump circuit DC2 inverts the sense latch SL from an initialization value. For example, the sense latch SL is updated with a value (refer to S313) indicating program inhibition.

In step S331, a determination is made as to whether programming of the first program state P1 is passed. When programming of the first program state P1 is passed, the verification read operation for the first program state P1 is skipped, and the method proceeds to step S351. When programming of the first program state P1 is failed, steps S335 through S337 are executed for the verification read operation for the first program state P1.

In step S335, the verification read operation is performed using the first verification voltage VFY1. For example, the bit lines BL1 through BLn are charged with a power supply voltage VCC. The first verification voltage VFY1 is applied to the selected word line WL. The sense latches SL latch voltages of the bit lines BL1 through BLn.

When a threshold voltage of a first MLC is higher than the first verification voltage VFY1, that is, when the first MLC is program-passed, the first MLC is turned OFF. When the first MLC is program-passed, a first bit line BL1 connected to the first MLC holds a power supply voltage VCC. When the first bit line BL1 holds the power supply voltage VCC, that is, when the first MLC is program-passed, an initialization value of a first sense latch SL1 connected to the first MLC is updated with an inverted value. For example, the sense latch SL is updated with a value (refer to S313) indicating program inhibition. For example, the first sense latch SL1 is updated with "1".

When a threshold voltage of a second MLC is lower than the first verification voltage VFY1, that is, when the second MLC is program-failed, the second MLC is turned ON. When the second MLC is program-failed, a second bit line BL2 connected with the second MLC decreases to a ground voltage VSS. When a voltage of the second bit line BL2 decreases up to the ground voltage VSS, that is, a second sense latch SL2 connected with the second bit line BL2 holds a value stored therein. For example, the sense latch SL holds a value (refer to S313) indicating program execution. For example, the second sense latch SL2 holds a value of "0".

In step S337, selection dump for the first program state P1 is performed using the second dump signal DUMP2. A threshold voltage distribution range of the second program state P2 is higher than that of the first program state P1. When MLC to be programmed to the second program state P2 are determined to be passed by the first verification voltage VFY1, threshold voltages of the MLC not rising to the threshold voltage distribution range of the second program state P2 belong to the threshold voltage distribution range of the first program state P1. Thus, a pass or fail determination for MLC to be programmed to the second program state P2 does not depend on the first verification voltage VFY1. Likewise, a pass or fail determination for MLC programmed to a third program state P3 does not depend on the first verification voltage VFY1.

In a page buffer PB where values of first and second data latches DL1 and DL2 indicate the second program state P2 or the third program state P3, a value of the sense latch SL is initialized in response to the second dump signal DUMP2. For example, a value of the sense latch SL is set with "0" (or, "1"). That is, MLC to be programmed to the second program state P2 or the third program state P3 are managed as not being passed by the first verification voltage VFY1. In MLC to be programmed to the second or third program state P2 or P3, a result of the verification read operation executed using the first verification voltage VFY1 is ignored. That is, results of the verification read operations for MLC to be programmed to the first program state P1 are selected.

In step S351, a determination is made as to whether programming for the second program state P2 is passed. When programming for the second program state P2 is passed, the verification read operation for the second program state P2 is skipped, and then the method proceeds to step S371. When programming for the second program state P2 is failed, steps S335 through S357 are executed for the verification read operation for the second program state P2.

In step S355, the verification read operation is performed using the second verification voltage VFY2. For example, when a threshold voltage of a first MLC is higher than a second verification voltage VFY2, for example, when programming of the first MLC is passed, an initialization value of the first sense latch SL1 connected with the first MLC is updated with an inverted value. That is, the sense latch SL may be updated with a value (refer to step S313) indicating program inhibition. When a threshold voltage of a second MLC is lower than the second verification voltage VFY2, for example, when programming of the second MLC is failed, the second sense latch SL2 connected with the second memory cell MC2 holds a value stored therein. That is, the sense latch SL holds a value (refer to step S313) indicating program execution.

In step S357, selection dump for the second program state P2 is performed using the second dump signal DUMP2. A threshold voltage distribution range of the third program state P3 is higher than that of the second program state P2. When MLC to be programmed to the third program state P3 are determined to be passed by the second verification voltage VFY2, the threshold voltages of MLC not falling in the threshold voltage distribution range of the second program state P2 belong to the threshold voltage distribution range of the second program state P2. Thus, a pass or fail determination for MLC to be programmed to the third program state P3 does not depend on the second verification voltage VFY2.

In a page buffer PB where values of first and second data latches DL1 and DL2 indicate the third program state P3, a value of the sense latch SL is set with "0" (or, "1"). That is, MLC to be programmed to the third program state P3 are managed as not being passed by the second verification voltage VFY2. In MLC to be programmed to the third program state P3, a result of the verification read operation executed using the second verification voltage VFY2 is ignored. That is, results of the verification read operations for MLC to be programmed to the second program state P2 are selected.

Thus, MLC to be programmed to the first program state P1 have threshold voltages lower than the second verification voltage VFY2. As described above, when a threshold voltage of a MLC is lower than a verification voltage, the sense latch SL holds a stored value. That is, even though the verification read operation for the second program state P2 is executed, a result of the verification read operation for the first program state P1 is not affected. That is, when the verification read operation for the second program state P2 is executed, a result of the verification read operation for the second program state P2 is additionally collected together with that of the verification read operation for the first program state P1.

In step S371, a determination is made as to whether programming of the third program state P3 is passed. When programming of the third program state P3 is passed, the verification read operation for the third program state P3 is skipped, and the method proceeds to step S315. When programming of the third program state P3 is failed, steps S375 through S381 are executed for the verification read operation for the third program state P3.

In step S375, the verification read operation is performed using the third verification voltage VFY3. For example, when a threshold voltage of a first MLC is higher than the third verification voltage VFY3, for example, when programming of the first MLC is passed, an initialization value of the first sense latch SL1 connected with the first MLC is updated with an inverted value. That is, the sense latch SL is updated with a value (refer to step S313) indicating program inhibition. When a threshold voltage of a second MLC is lower than the third verification voltage VFY3, for example, when programming of the second MLC is failed, the second sense latch SL2 connected with the second MLC holds a value stored therein. That is, the sense latch SL holds a value (refer to step S313) indicating program execution.

A program state having a threshold voltage distribution range higher than the third program state P3 does not exist. Thus, the selection dump is not performed during the verification read operation for the third program state P3.

MLC to be programmed to the first program state P1 or the second program state P2 have threshold voltages lower than the third verification voltage VFY3. As described above, when a threshold voltage of a MLC is lower than a verification voltage, the sense latch SL holds a stored value. That is, even though the verification read operation for the third program state P3 is executed, a result of the verification read operation for the first program state P1 or the second program state P2 is not affected. Thus, when the verification read operation for the first program state P1 or the second program state P2 is executed, a result of the verification read operation for the third program state P3 is additionally collected together with that of the verification read operation for the first program state P1 and the second program state P2.

In step S381, inhibit dump is performed using the second dump signal DUMP2. In each page buffer PB, when a value of the sense latch SL indicates program pass, for example, is "1", the first and second data latches DL1 and DL2 are updated to indicate program inhibition, for example, an erase state E. That is, the first and second data latches DL1 and DL2 of a memory cell, having a threshold voltage higher than a corresponding verification voltage, from among MLC to be programmed to one of the first through third program states P1 through P3 are updated to indicate the erase state E. Programming in a following program loop PM is inhibited when the first and second data latches DL1 and DL2 are updated to indicate the erase state E.

That is, in step S335, the verification read result for the first program state P1 is collected in the sense latches SL. In step S355, the verification read result for the second program state P2 is collected in the sense latches SL. In step S375, the verification read result for the third program state P3 is collected in the sense latches SL. In step S381, the verification read result for the first program state P1, the verification read result for the second program state P2, and the verification read result for the third program state P3 are dumped to the first data latches DL1 and the second data latches DL2.

After step S381, a next program loop PM may be executed from S315. For example, in step S323, a sense latch SL corresponding to a MLC having the erase state E is set to indicate program inhibition. In step S335, a sense latch SL corresponding to a program-passed MLC (i.e., erase-inhibited MLC) of memory cells to be programmed to the first program state P1 is updated to indicate program inhibition. In step S355, a sense latch SL corresponding to a program-passed MLC (i.e., erase-inhibited memory cell MC) of memory cells to be programmed to the second program state P2 is updated to indicate program inhibition. In step S375, a sense latch SL corresponding to a program-passed MLC (i.e., erase-inhibited memory cell MC) of memory cells to be programmed to the third program state P3 is updated to indicate program inhibition. That is, when step S375 is executed, a sense latch SL that corresponds to a MLC having an erase state E as a target state or corresponds to a program-passed MLC having one of the first through third program states P1 through P3 as a target state indicates program inhibition. A sense latch SL that corresponds to a program-failed MLC having one of the first through third program states P1 through P3 as a target state indicates program execution. Thus, after step S381, programming (S315) is executable without setting (S313) of the sense latches SL.

As described with reference to FIG. 8, dump is made in plurality while one program loop PM is executed. For example, when MLC are programmed to have first through N-th program states (N being a positive integer of 3 or more), one program loop contains one program dump operation for dumping data of the first and second data latches DL1 and DL2 to the sense latches SL (S113), one selection dump operation (S323), (N−1) selection dump operations, and one inhibit dump operation. That is, (N+1) dump operations are performed because no dump of step S313 is not performed from a following program loop PM.

The number of dump operations is markedly reduced as compared with a program operation described with reference to FIG. 6. Additionally, the number of events cause initialization of the sense latches SL is also markedly reduced. Thus, operating speed of a nonvolatile memory 110 is further improved.

Figure 9:
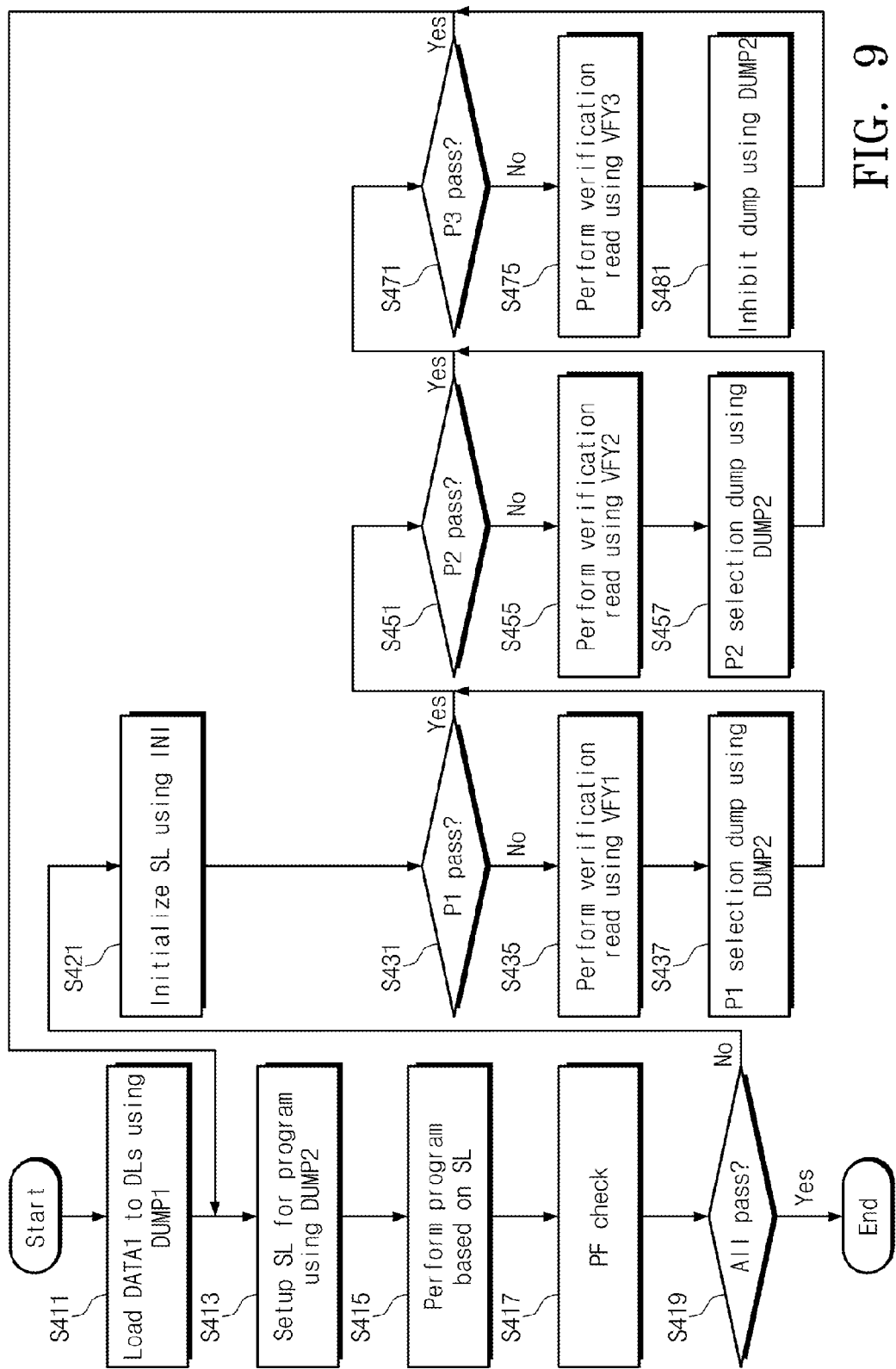

FIG. 9 is a flow chart summarizing in some additional detail one example of the method of executing a program operation described in relation to FIG. 7 according to certain embodiments of the inventive concept. Referring to FIGS. 1, 2, 3, 4 and 9, in step S411, first data DATA1 to be programmed at memory cells connected with a selected word line is loaded on data latches DL using first dump signal DUMP1 and second dump signal DUMP2.

In step S413, sense latches SL are set using the second dump signal DUMP2.

In step S415, programming is performed based on the sense latches SL. For example, bit lines BL1 through BLn are biased according to values set in the sense latches SL.

In step S417, a determination is made as to whether programming of MLC is passed or failed.

In step S419, a determination is made as to whether programming of all program states P1 through P3 is passed or failed. When programming for all program states P1 through P3 is passed, the method ends. When programming for all program states P1 through P3 is not passed, verification read operations may be performed.

Steps S411 through S419 are performed substantially the same as steps S311 through S319 described with reference to FIG. 8.

In step S421, sense latches SL are initialized using an initialization signal INI. Step S421 is performed substantially the same as step S321 described with reference to FIG. 8. Unlike a program operation described with reference to FIG. 8, selection dump (S323) for the erase state E is not performed.

In step S431, whether programming of the first program state P1 is passed is determined. When programming of the first program state P1 is passed, a verification read operation for the first program state P1 is skipped, and the method proceeds to step S451. When programming of the first program state P1 is failed, steps S435 through S437 are executed for the verification read operation for the first program state P1.

In step S435, the verification read operation is performed using the first verification voltage VFY1.

In step S437, selection dump for the first program state P1 is performed using second dump signal DUMP2.

Steps S431 through S437 are performed substantially the same as steps S331 through S337 described with reference to FIG. 8.

In step S451, whether programming of the second program state P2 is passed is determined. When programming of the second program state P2 is passed, a verification read operation for the second program state P2 is skipped, and the method proceeds to step S471. When programming of the second program state P2 is failed, steps S455 through S457 are executed for the verification read operation for the second program state P2.

In step S455, the verification read operation is performed using the second verification voltage VFY2.

In step S457, selection dump for the second program state P2 is performed using the second dump signal DUMP2.

Steps S451 through S457 are performed substantially the same as steps S351 through S357 described with reference to FIG. 8.

In step S471, a determination is made as to whether programming of the third program state P3 is passed. When programming of the third program state P3 is passed, a verification read operation for the third program state P3 is skipped, and the method proceeds to step S413. When programming of the third program state P3 is failed, steps S475 and S481 are executed for the verification read operation for the third program state P3.

In step S475, the verification read operation is performed using the third verification voltage VFY3.

In step S481, inhibit dump is performed using the second dump signal DUMP2.

Steps S471 through S481 are performed substantially the same as steps S371 through S381 described with reference to FIG. 8.

After step S481, a next program loop PM is executed from step S413. A program operation of FIG. 9 is performed substantially the same as that of FIG. 8, except that a next program loop is executed from S413 without selection dump (S323) for the erase state E.

As described with reference to FIG. 9, a plurality of dump operations may be performed during execution of a program loop PM. For example, when MLC are programmed to have first through N-th program states (N being a positive integer of 3 or more), one program loop contains one program dump operation for dumping data of the first and second data latches DL1 and DL2 to the sense latches SL (S413), (N−1) selection dump operations, and one inhibit dump operation. That is, (N+1) dump operations are performed in each program loop PM.

The number of dump operations is markedly reduced as compared with a program operation described with reference to FIG. 6. Additionally, the number of events causing sense latches SL to be initialized is also markedly reduced. Thus, operating speed of a nonvolatile memory 110 may be improved.

Figure 10:
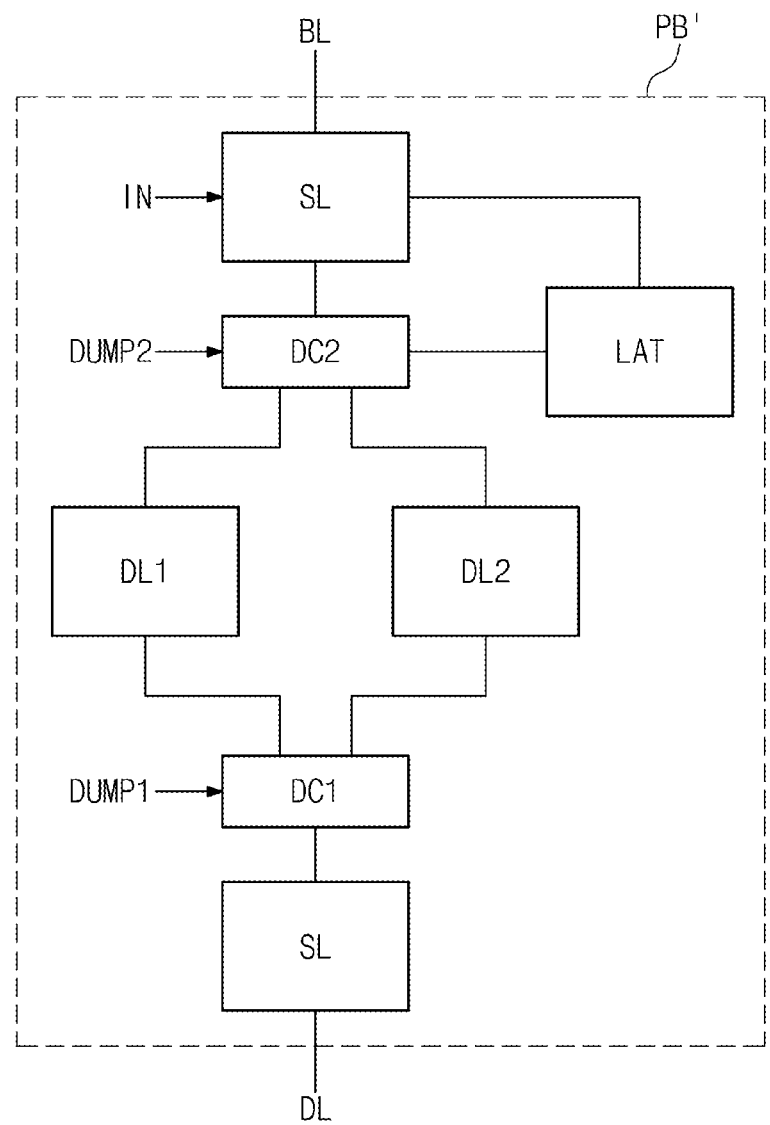
FIG. 10 is a block diagram illustrating in another example a page buffer that may be used in certain embodiments of the inventive concept.

FIG. 10 is a block diagram illustrating a page buffer PB' according to another embodiment of the inventive concept. Referring to FIG. 10, the page buffer PB' includes a cache latch CL, a first dump circuit DC1, a first data latch DL1, a second data latch DL2, a second dump circuit DC2, a sense latch SL, and a verification latch LAT. Thus, the page buffer PB' of FIG. 10 further includes the verification latch LAT, as compared with the page buffer PB of FIG. 4.

During a verification read operation, the verification latch LAT is initialized to have a first value. The verification latch LAT may be used to detect whether an initialization value of the sense latch SL is inverted. When an initialization value of the sense latch SL is inverted, the verification latch LAT is updated to have a second value different from the first value. In response to second dump signal DUMP2, the second dump circuit DC2 performs selection dump of first through third program states P1 through P3 with respect to the verification latch LAT.

During a verification read operation for the first program state P1, for example, when values of the first and second data latches DL1 and DL2 indicate the second program state P2 or the third program state P3, the second dump circuit DC2 controls the verification latch LAT to have a first value. During a verification read operation of the second program state P2, for example, when values of the first and second data latches DL1 and DL2 indicate the third program state P3, the second dump circuit DC2 controls the verification latch LAT to have a first value.

In response to the second dump signal DUMP2, the second dump circuit DC2 performs inhibit dump according to a value of the verification latch LAT. For example, when the verification latch LAT has a second value, the second dump circuit DC2 updates the first and second data latches DL1 and DL2 to indicate an erase state E. When the verification latch LAT has the first value, the second dump circuit DC2 makes the first and second data latches DL1 and DL2 hold stored values.

As described with reference to FIG. 4, verification read results of the first through third program states P1 through P3 are collected in sense latches SL. As described with reference to FIG. 10, verification read results of the first through third program states P1 through P3 are collected in verification latches LAT, not the sense latches SL. However, the scope of the inventive concept may not be limited to a case wherein verification read results of different program states are collected in a particular latch of a page buffer PB.

Figure 11:
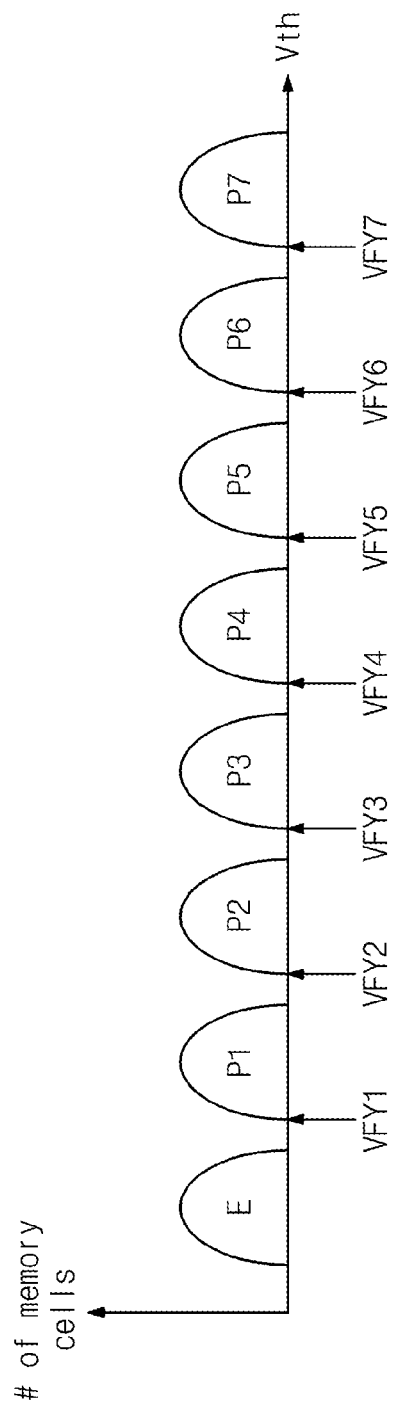
FIG. 11 is an exemplary voltage distribution diagram for a TLC that may be used in certain embodiments of the inventive concept.

FIG. 11 is an exemplary voltage distribution diagram for a TLC that may be used in certain embodiments of the inventive concept. In FIG. 11, the abscissa indicates the level of a threshold voltage Vth, and the ordinate indicates a number of memory cells MC.

Referring to FIG. 11, TLC may have an erase state E or one of seventh program states P1 through P7. First through seventh verification read operations for the first through seventh program states P1 through P7 are executed using first through seventh verification voltages VFY1 through VFY7.

Figure 12:
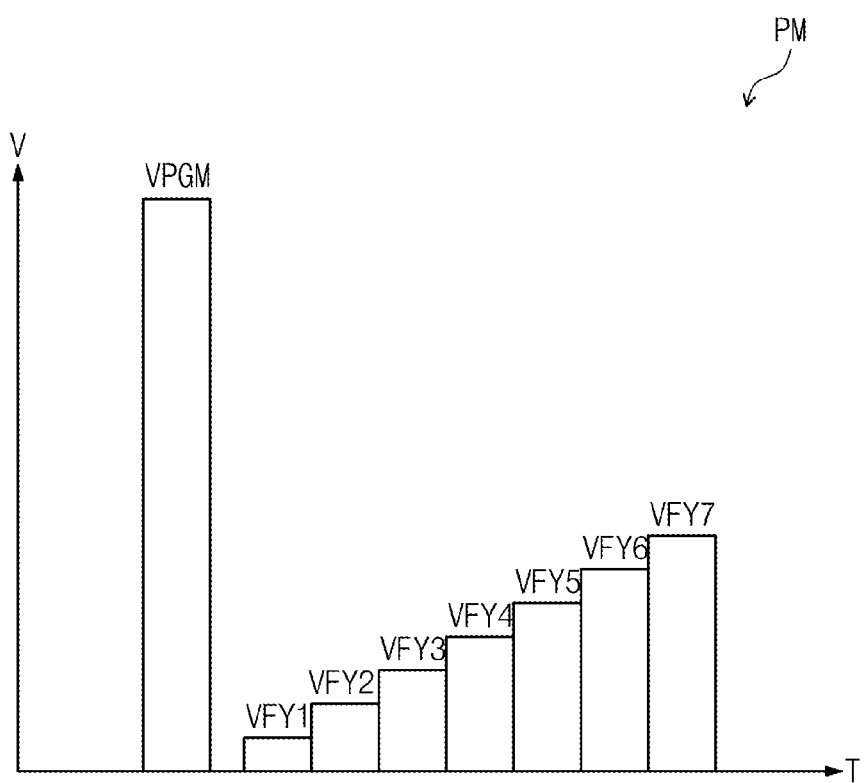
FIG. 12 is a timing diagram illustrating one exemplary approach to the programming of a TLC that may be used in certain embodiments of the inventive concept.

FIG. 12 is a timing diagram illustrating one exemplary approach to the programming of a TLC (e.g., a program loop PM) that may be used in certain embodiments of the inventive concept. In FIG. 12, the abscissa indicates time (T), and the ordinate indicates a voltage level (V).

Referring to FIGS. 11 and 12, in a program loop PM, first through third verification voltages VFY1 through VFY7 are sequentially applied after a program voltage VPGM is applied. That is, in one program loop PM, first through seventh verification read operations are executed using the first through seventh verification voltages VFY1 through VFY7.

Each of the first through sixth verification read operations that use the first through sixth verification voltages VFY1 through VFY6 includes a selection dump operation. The seventh verification read operation that uses the seventh verification voltages VFY7 does not include a selection dump operation. When the seventh verification read operation is performed using the seventh verification voltage VFY7, results of the first through seventh verification read operations using the first through seventh verification voltages VFY1 through VFY7 are collected. After the seventh verification read operation is performed, inhibit dump is executed to dump the first through seventh verification read result thus collected to data latches DL.

In exemplary embodiments, a page buffer PB may include three data latches DL when 3-bit data is programmed at a memory cell.

FIG. 11 is an exemplary voltage distribution diagram for a QLC that may be used in certain embodiments of the inventive concept. In FIG. 11, the abscissa indicates the level of a threshold voltage Vth, and the ordinate indicates a number of memory cells MC.

Figure 13:
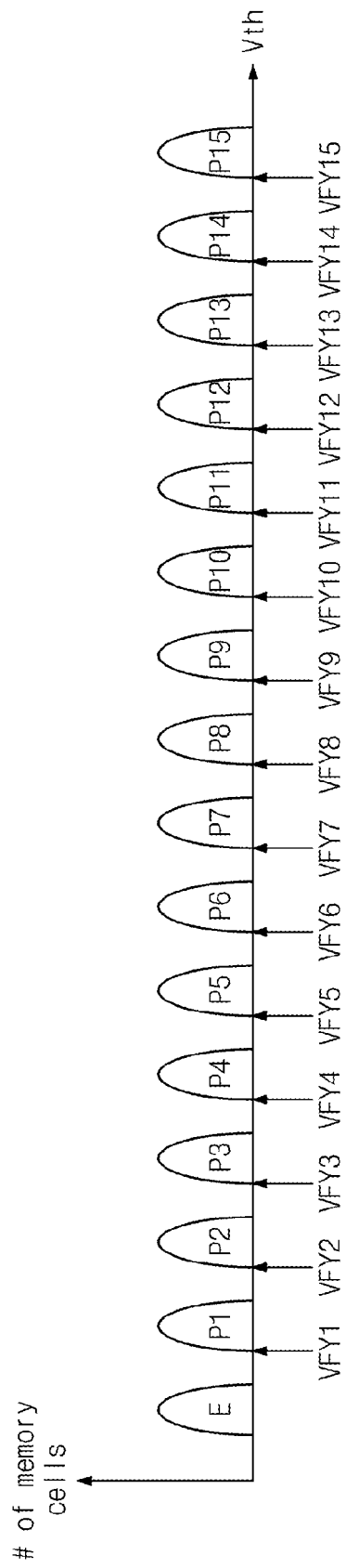
FIG. 13 is an exemplary voltage distribution diagram for a QLC that may be used in certain embodiments of the inventive concept.

Referring to FIG. 13, QLC may have an erase state E or one of $1^{st}$ through $15^{th}$ program states P1 through P15. First through $15^{th}$ verification read operations for the $1^{st}$ through $15^{th}$ program states P1 through P15 are executed using $1^{st}$ through $15^{th}$ verification voltages VFY1 through VFY15.

Figure 14:
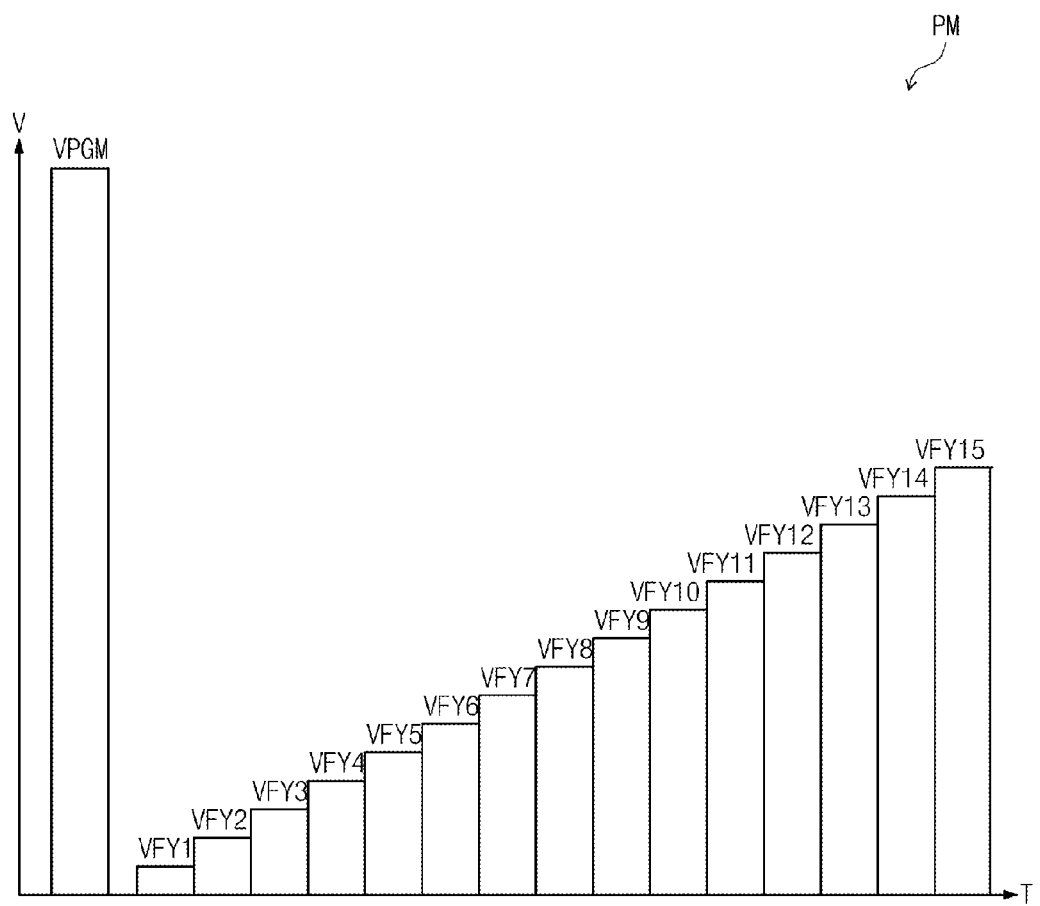
FIG. 14 is a timing diagram illustrating one exemplary approach to the programming of a QLC that may be used in certain embodiments of the inventive concept.

FIG. 14 is a timing diagram illustrating one exemplary approach to the programming of a QLC (e.g., a program loop PM) that may be used in certain embodiments of the inventive concept. In FIG. 12, the abscissa indicates time (T), and the ordinate indicates a voltage level (V).

Referring to FIGS. 13 and 14, in a program loop PM, $1^{st}$ through $15^{th}$ verification voltages VFY1 through VFY15 are sequentially applied after a program voltage VPGM is applied. That is, in one program loop PM, $1^{st}$ through $15^{th}$ verification read operations are executed using the $1^{st}$ through $15^{th}$ verification voltages VFY1 through VFY15.

Each of the $1^{st}$ through $14^{th}$ verification read operations that use the $1^{st}$ through $14^{th}$ verification voltages VFY1 through VFY14 includes a selection dump operation. The $15^{th}$ verification read operation that uses the $15^{th}$ verification voltages VFY15 does not include a selection dump operation. When the $15^{th}$ verification read operation is performed using the $15^{th}$ verification voltage VFY15, results of the $1^{st}$ through $15^{th}$ verification read operations using the $1^{st}$ through $15^{th}$ verification voltages VFY1 through VFY15 are collected. After the $15^{th}$ verification read operation is performed, inhibit dump is executed to dump the $1^{st}$ through $15^{th}$ verification read result thus collected to data latches DL.

In exemplary embodiments, a page buffer PB may include four data latches DL when 4-bit data is programmed at a memory cell.

FIG. 15 is a table comparing inhibit dump counts for MLC, TLC, and QLC in relation to different programming approaches. Referring to FIGS. 1, 2, and 15, MLC are assumed to the nonvolatile memory 110. In this case, the number of program states for MLC is three. Using the program operation described with reference to FIG. 6, inhibit dump is performed three times in each program loop. In contrast, using one of the program operations described with reference to FIGS. 8 and 9, inhibit dump is performed once in each program loop. Thus, the inhibit dump count is reduced by 66.7% when the program operation of FIG. 6 is replaced with a program operation of FIG. 8 or 9, for example.

Next, TLC are assumed for the memory cells of the nonvolatile memory 110. In this case, the number of program states for TLC is seven 7". With the program operation of FIG. 6, inhibit dump is performed seven times in each program loop. In contrast, with the program operation of FIGS. 8 and 9, inhibit dump is performed once in each program loop. Thus, an inhibit dump count is reduced by 85.7% when the program operation of FIG. 6 is replaced with a program operation of FIG. 8 or 9.

Finally, QLC are assumed for the memory cells of the nonvolatile memory 110. In this case, the number of program states for the QLC is fifteen. With the program operation of FIG. 6, inhibit dump is performed fifteen times in each program loop. In contrast, with a program operation like the ones described in relation to FIGS. 8 and 9, inhibit dump is performed once in each program loop. Thus, an inhibit dump count is reduced by 93.3% when a program operation of FIG. 6 is replaced with a program operation of FIG. 8 or 9.

Thus, using program operations consistent with embodiments of the inventive concept, and despite configuring memory cells to store 2, 3, 4 or more data bits, the overall number inhibit dump operation associated with the program operations may be substantially reduced.

Figure 16:
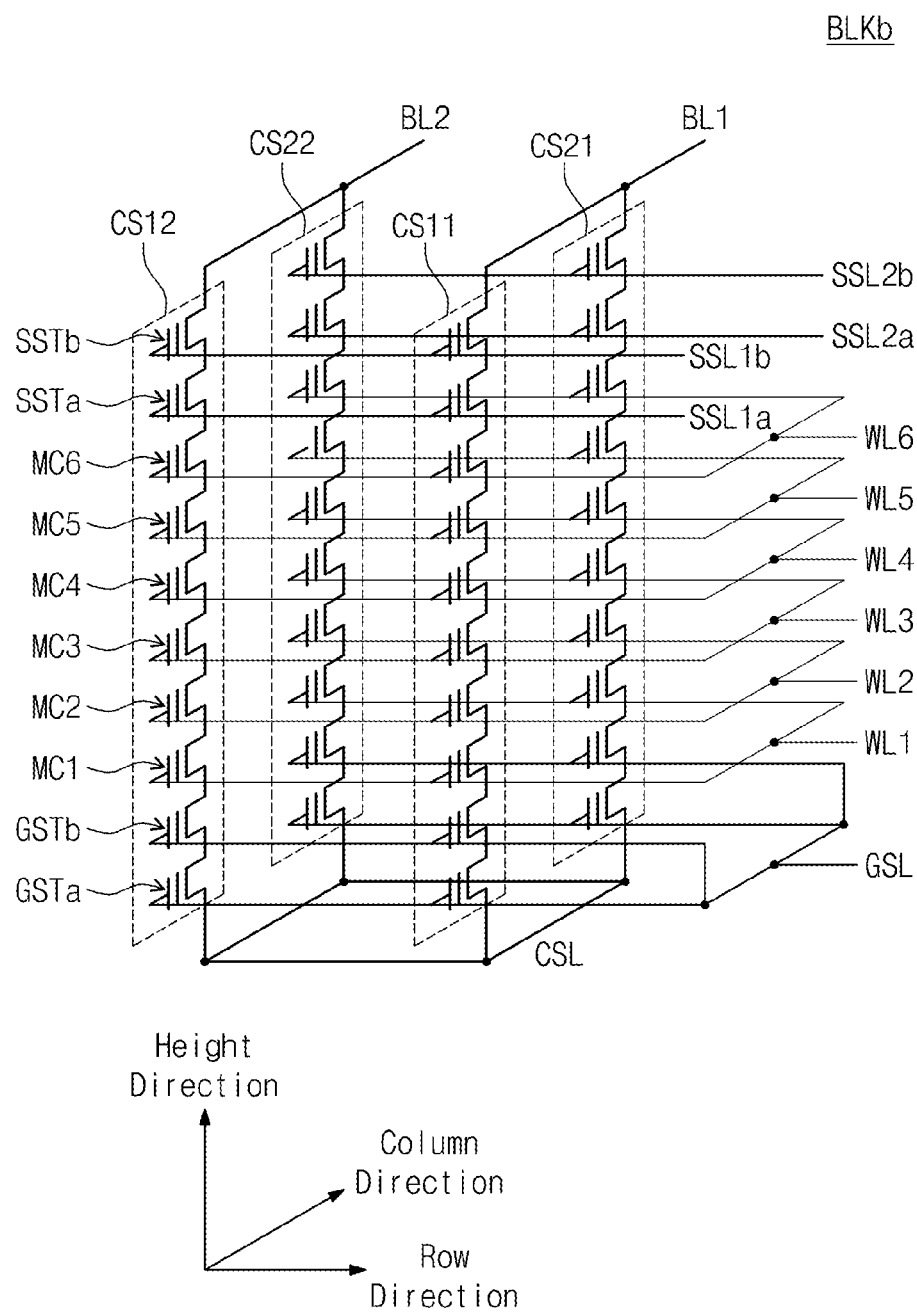
FIG. 16 is a circuit diagram illustrating one possible implementation for a three-dimensional memory block that may be used in certain embodiments of the inventive concept.

FIG. 16 is a circuit diagram illustrating a three-dimensional memory block BLKb that may be used in certain embodiments of the inventive concept. Referring to FIG. 16, a memory block BLKb includes a plurality of cell strings CS11 through CS21 and CS12 through CS22. The plurality of cell strings CS11 through CS21 and CS12 through CS22 are arranged along a row direction and a column direction and form rows and columns.

For example, the cell strings CS11 and CS12 arranged along the row direction form a first row, and the cell strings CS21 and CS22 arranged along the row direction form a second row. The cell strings CS11 and CS21 arranged along the column direction form a first column, and the cell strings CS12 and CS22 arranged along the column direction form a second column.

Each cell string contains a plurality of cell transistors. The cell transistors include ground selection transistors GSTa and GSTb, memory cells MC1 through MC6, and string selection transistors SSTa and SSTb. The ground selection transistors GSTa and GSTb, memory cells MC1 through MC6, and string selection transistors SSTa and SSTb of each cell string are stacked in a height direction perpendicular to a plane (e.g., plane above a substrate of the memory block BLKb) on which the cell strings CS11 through CS21 and CS12 through CS22 are arranged along rows and columns.

Each cell transistor may be formed of a charge trap type cell transistor of which the threshold voltage varies with the amount of charge trapped in its insulation layer.

Lowermost ground selection transistors GSTa are connected in common to a common source line CSL.

The ground selection transistors GSTa and GSTb of the plurality of cell strings CS11 through CS21 and CS12 through CS22 are connected in common to a ground selection line GSL.

In exemplary embodiments, ground selection transistors with the same height (or, order) may be connected to the same ground selection line, and ground selection transistors with different heights (or, orders) may be connected to different ground selection lines. For example, the ground selection transistors GSTa with a first height are connected in common to a first ground selection line, and the ground selection transistors GSTb with a second height are connected in common to a second ground selection line.

In exemplary embodiments, ground selection transistors in the same row may be connected to the same ground selection line, and ground selection transistors in different rows may be connected to different ground selection lines. For example, the ground selection transistors GSTa and GSTb of the cell strings CS11 and CS12 in the first row are connected in common to the first ground selection line and the ground selection transistors GSTa and GSTb of the cell strings CS21 and CS22 in the second row are connected in common to the second ground selection line.

Connected in common to a word line are memory cells that are placed at the same height (or, order) from the substrate (or, the ground selection transistors GST). Connected to different word lines WL1 through WL6 are memory cells that are placed at different heights (or, orders). For example, the memory cells MC1 are connected in common to the word line WL1, the memory cells MC2 are connected in common to the word line WL2, and the memory cells MC3 are connected in common to the word line WL3. The memory cells MC4 are connected in common to the word line WL4, the memory cells MC5 are connected in common to the word line WL5, and the memory cells MC6 are connected in common to the word line WL6.

In first string selection transistors SSTa, having the same height (or, order), of the cell strings CS11 through CS21 and CS12 through CS22, the first string selection transistors SSTa in different rows are connected to different string selection lines SSL1a and SSL2a. For example, the first string selection transistors SSTa of the cell strings CS11 and CS12 are connected in common to the string selection line SSL1a, and the first string selection transistors SSTa of the cell strings CS21 and CS22 are connected in common to the string selection line SSL2a.

In second string selection transistors SSTb, having the same height (or, order), of the cell strings CS11 through CS21 and CS12 through CS22, the second string selection transistors SSTb in different rows are connected to the different string selection lines SSL1a and SSL2a. For example, the second string selection transistors SSTb of the cell strings CS11 and CS12 are connected in common to the string selection line SSL1b, and the second string selection transistors SSTb of the cell strings CS21 and CS22 are connected in common to the string selection line SSL2b.

That is, cell strings in different rows may be connected to different string selection lines. String selection transistors, having the same height (or, order), of cell strings in the same row may be connected to the same string selection line. String selection transistors, having different heights (or, orders), of cell strings in the same row may be connected to different string selection lines.

In exemplary embodiments, string selection transistors of cell strings in the same row may be connected in common to a string selection line. For example, string selection transistors SSTa and SSTb of cell strings CS11 and CS12 in the first row are connected in common to a string selection line, and string selection transistors SSTa and SSTb of cell strings CS21 and CS22 in the second row are connected in common to a string selection line.

Columns of the cell strings CS11 through CS21 and CS12 through CS22 are connected to different bit lines BL1 and BL2, respectively. For example, string selection transistors SSTb of the cell strings CS11 and CS21 in the first column are connected in common to the bit line BL1, and string selection transistors SSTb of the cell strings CS12 and CS22 in the second column are connected in common to the bit line BL2.

The memory block BLKb shown in FIG. 16 is exemplary. However, the scope and spirit of the inventive concept may not be limited thereto. For example, the number of rows of cell strings may increase or decrease. If the number of rows of cell strings is changed, the number of string or ground selection lines and the number of cell strings connected to a bit line may also be changed.

The number of columns of cell strings may increase or decrease. If the number of columns of cell strings is changed, the number of bit lines connected to columns of cell strings and the number of cell strings connected to a string selection line may also be changed.

A height of the cell strings may increase or decrease. For example, the number of ground selection transistors, memory cells, or string selection transistors that are stacked in each cell string may increase or decrease.

In exemplary embodiments, reading and writing may be performed by the row. The cell strings CS11 through CS21 and CS12 through CS22 may be selected by the row by controlling activation of the string selection lines SSL1a, SSL1b, SSL2a, and SSL2b.

In a selected row of the cell strings CS11 through CS21 and CS12 through CS22, writing and reading is performed by the word line. In a selected row of the cell strings CS11 through CS21 and CS12 through CS22, memory cells connected with a selected word line may be programmed.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer. Each vertical NAND string further includes at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 17:
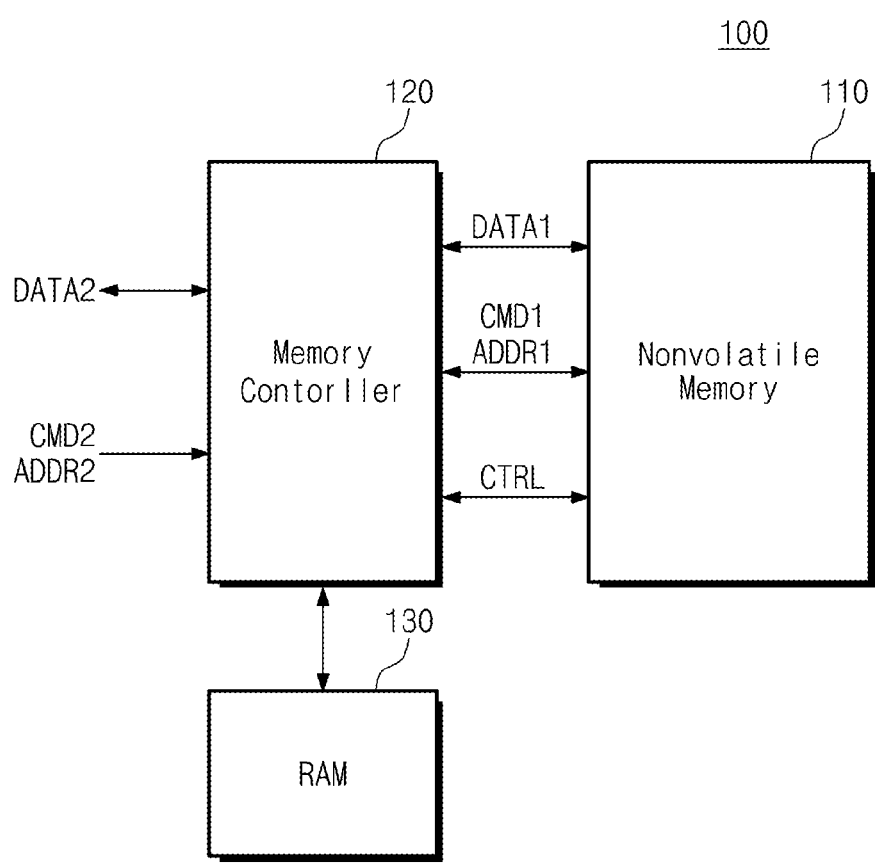
FIG. 17 is a block diagram illustrating a storage device according to embodiments of the inventive concept.

FIG. 17 is a block diagram illustrating a storage device 100 according to embodiments of the inventive concept. Referring to FIG. 17, the storage device 100 includes a nonvolatile memory 110, a memory controller 120, and a RAM 130.

The nonvolatile memory 110 performs read, write, and erase operations according to a control of the memory controller 120. The nonvolatile memory 110 exchanges first data DATA1 with the memory controller 120. For example, the nonvolatile memory 110 receives the first data DATA1 from the memory controller 120 and stores the first data DATA1. The nonvolatile memory 110 performs a read operation and outputs the read data to the memory controller 120.

The nonvolatile memory 110 receives a first command CMD1 and a first address ADDR1 from the memory controller 120. The nonvolatile memory 110 exchanges a control signal CTRL with the memory controller 120. For example, the nonvolatile memory 110 receives, from the memory controller 120, at least one of a chip enable signal /CE for selecting at least one of a plurality of semiconductor devices constituting the nonvolatile memory 110, a command latch enable signal CLE indicating that a signal received from the memory controller 120 is the first command CMD1, an address latch enable signal ALE indicating that a signal received from the memory controller 120 is the first address ADDR1, a read enable signal /RE received from the memory controller 120 at a read operation, periodically toggled, and used to tune timing, a write enable signal /WE activated by the memory controller 120 when the first command CMD1 or the first address ADDR1 is transmitted, a write protection signal /WP activated by the memory controller 120 to prevent unintended writing or erasing when a power changes, and a data strobe signal DQS used to adjust input synchronization for the first data DATA1 and generated from the memory controller 120 at a write operation so as to be periodically toggled. For example, the nonvolatile memory 110 outputs, to the memory controller 120, at least one of a ready/busy signal R/nB indicating whether the nonvolatile memory 110 is performing a program, erase or read operation and a data strobe signal DQS used to adjust output synchronization for the first data DATA1 and generated from the read enable signal /RE by the nonvolatile memory 110 so as to be periodically toggled.

The nonvolatile memory 110 may include a nonvolatile memory 110 that is described with reference to FIGS. 1 through 16.

The nonvolatile memory 110 may include a flash memory. However, the scope and spirit of the inventive concept may not be limited thereto. For example, the nonvolatile memory 110 may incorporate at least one of nonvolatile memories, such as PRAM (Phase-change RAM), MRAM (Magnetic RAM), RRAM (Resistive RAM), and FeRAM (Ferroelectric RAM).

The memory controller 120 is configured to control the nonvolatile memory 110. For example, the nonvolatile memory 110 performs a write, read, or erase operation according to a control of the memory controller 120. The memory controller 120 exchanges the first data DATA1 and the control signal CTRL with the nonvolatile memory 110 and outputs the first command CMD1 and the first address ADDR1 to the nonvolatile memory 110.

The memory controller 120 controls the nonvolatile memory 110 according to a control of an external host device (not shown). The memory controller 120 exchanges second data DATA2 with the host device and receives a second command CMD2 and a second address ADDR2 therefrom.

In exemplary embodiments, the memory controller 120 exchanges the first data DATA1 with the nonvolatile memory 110 by a first time unit; moreover, it exchanges the second data DATA2 with the host device by a second time unit different from the first time unit.

Based on a first format, the memory controller 120 exchanges the first data DATA1 with the nonvolatile memory 110 and transmits the first command CMD1 and the first address ADDR1 to the nonvolatile memory 110. Based on a second format different from the first format, the memory controller 120 exchanges the second data DATA2 with the host device and receives the second command CMD2 and the second address ADDR2 from the host device.

The memory controller 120 uses the RAM 130 as a working memory, a buffer memory, or a cache memory. For example, the memory controller 120 receives the second data DATA2 from the host device and stores the second data DATA2 in the RAM 130. The memory controller 120 writes the second data DATA2 stored in the RAM 130 at the nonvolatile memory 110 as the first data DATA1. The memory controller 120 reads the first data DATA1 from the nonvolatile memory 110 and stores the first data DATA1 thus read in the RAM 130. The memory controller 120 outputs the first data DATA1 stored in the RAM 130 to the host device as the second data DATA2. The memory controller 120 stores data read from the nonvolatile memory 110 at the RAM 130 and writes the data stored in the RAM 130 back at the nonvolatile memory 110.

The memory controller 120 stores data or codes, needed to manage the nonvolatile memory 110, at the RAM 130. For example, the memory controller 120 reads data or codes, needed to manage the nonvolatile memory 110, from the nonvolatile memory 110 and loads the read data or codes on the RAM 130 for driving.

The RAM 130 may include at least one of a variety of random access memories, such as, but not limited to, a static RAM, a dynamic RAM, a synchronous DRAM (SRAM), a Phase-change RAM (PRAM), a Magnetic RAM (MRAM), a Resistive RAM (RRAM), and a Ferroelectric RAM (FRAM).

To reduce overhead due to an erase operation of the nonvolatile memory 110, the storage device 100 performs address mapping. For example, when overwriting is requested from an external host device, the storage device 100 erases memory cells storing old data and stores overwrite-requested data at memory cells of a free storage space, not memory cells at the erased memory cells. The memory controller 120 drives a flash translation layer (FTL) that manages a correlation between logical address used in the external host device and physical addresses used in the nonvolatile memory 110 according to the above-described way. For example, the second address ADDR2 may be a logical address, and the first address ADDR1 may be a physical address.

The storage device 100 performs an operation of writing, reading or erasing data according to a request of the host device. The storage device 100 may include a solid state drive (SSD) or a hard disk drive (HDD). The storage device 100 may include memory cards, such as PC card (PCMCIA, personal computer memory card international association), compact flash card, smart media card (SM, SMC), memory stick, multimedia card (MMC, RS-MMC, MMCmicro), SD card (SD, miniSD, microSD, SDHC), USB (Universal Serial Bus) memory card, and universal flash storage (UFS). The storage device 100 may include embedded memories, such as eMMC (embedded MultiMedia Card), UFS, and PPN (Perfect Page New).

Figure 18:
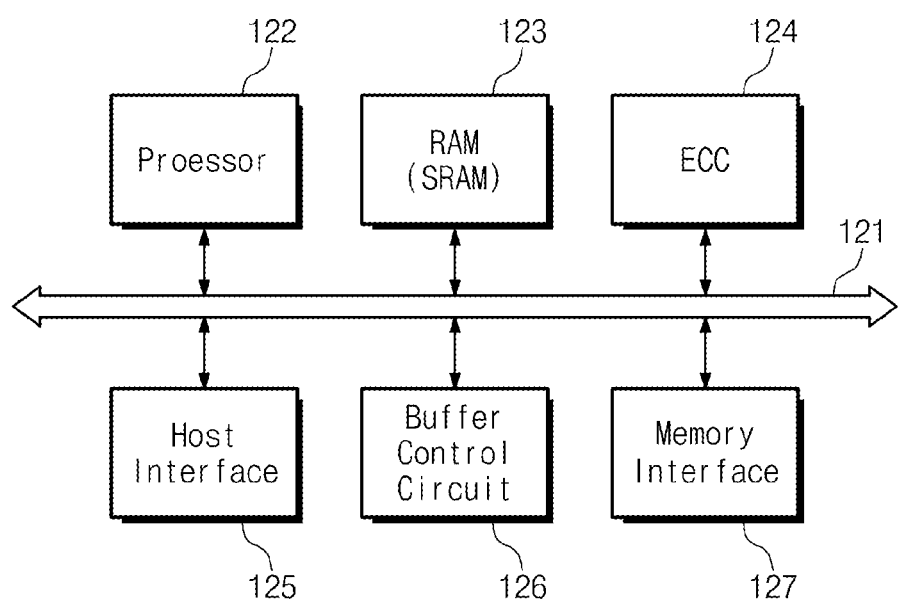
FIG. 18 is a block diagram further illustrating the memory controller 120 of FIG. 17 according to an embodiment of the inventive concept.

FIG. 18 is a block diagram further illustrating in one example the memory controller 120 of FIG. 17 according to an embodiment of the inventive concept. Referring to FIG. 18, a memory controller 120 comprises a bus 121, a processor 122, a RAM 123, an ECC block 124, a host interface 125, a buffer control circuit 126, and a memory interface 127.

The bus 121 may be configured to provide a channel among components of the memory controller 120.

The processor 122 controls an overall operation of the memory controller 120 and executes a logical operation. The processor 122 communicates with an external host device 100 (refer to FIG. 1) through the host interface 125. The processor 122 stores, in the RAM 123, a second command CMD2 or a second address ADDR2 received through the host interface 125. The processor 122 produces a first command CMD1 and a first address ADDR1 according to the second command CMD2 or the second address ADDR2 stored in the RAM 123. The processor 122 outputs the first command CMD1 and the first address ADDR1 through the memory interface 127.

The processor 122 outputs the second data DATA2 received from the host interface 125 through the buffer control circuit 126 or stores it in the RAM 123. The processor 122 outputs, through the memory interface 127, data stored in the RAM 123 or data received through the buffer control circuit 126. The processor 122 stores the first data DATA1 received through the memory interface 127 in the RAM 123 or outputs it through the buffer control circuit 126. Under a control of the processor 122, data stored in the RAM 123 or data received through the buffer control circuit 126 is output through the host interface 125 as the second data DATA2 or is output through the memory interface 127 as the first data DATA1.

The RAM 123 is used as a working memory, a cache memory, or a buffer memory of the processor 122. The RAM 123 stores codes or instructions that the processor 122 will execute. The RAM 123 stores data processed by the processor 122. The RAM 123 may include an SRAM.

The ECC block 124 performs an error correction operation. The ECC block 124 generates parity for error correction, based on first data DATA1 to be output to the memory interface 127 or second data DATA2 received from the host interface 125. The first data DATA1 and parity may be output through the memory interface 127. The ECC block 124 corrects an error of first data DATA1 using the first data DATA1 and parity that are received through the memory interface 127. The ECC block 124 may be implemented as a component of the memory interface 127.

The host interface 125 communicates with the external host device 100 (refer to FIG. 1) according to a control of the processor 122. The host interface 125 receives the second command CMD2 and the second address ADDR2 from the external host device and exchanges the second data DATA2 with the external host device.

The host interface 125 may communicate using at least one of various communication manners, such as Universal Serial Bus (USB), Serial AT Attachment (SATA), High Speed Inter-chip (HSIC), Small Computer System Interface (SCSI), Firewire, Peripheral Component Interconnection (PCI), PCI express (PCIe), Nonvolatile Memory express (NVMe), Universal Flash Storage (UFS), Secure Digital (SD), Multi-Media Card (MMC), and embedded MMC (eMMC)).

The buffer control circuit 126 is configured to control a RAM 123 (refer to FIG. 1) according to a control of the processor 122. The buffer control circuit 126 writes data at the RAM 130 and reads data therefrom.

The memory interface 127 is configured to communicate with a nonvolatile memory 110 (refer to FIG. 1) according to a control of the processor 122. The memory interface 127 sends a first command CMD1 and a first address ADDR1 to the nonvolatile memory 110 and exchanges first data DATA1 and a control signal CTRL with the nonvolatile memory 110.

In exemplary embodiments, a storage device 100 may be configured not to include the RAM 130. That is, the storage device 100 does not have the memory controller 120 and the nonvolatile memory 110 at the outside. In this case, the memory controller 120 does not include the buffer control circuit 126. A function of the RAM 130 is carried out using the RAM 123 of the memory controller 120.

In exemplary embodiments, the processor 122 controls the memory controller 120 using codes. The processor 122 may load codes from a nonvolatile memory (e.g., read only memory) that is implemented in the memory controller 120. Or, the processor 122 may load codes received from the memory interface 127.

In exemplary embodiments, the bus 121 of the memory controller 120 is divided into a control bus and a data bus. The data bus transfers data in the memory controller 120, and the control bus is configured to transfer control information in the memory controller 120: a command and an address. The data bus and the control bus are separated to prevent mutual interference or influence. The data bus is connected with the host interface 125, the buffer control circuit 126, the ECC block 124, and the memory interface 127. The control bus is connected with the host interface 125, the processor 122, the buffer control circuit 126, the RAM 123, and the memory interface 127.

Figure 19:
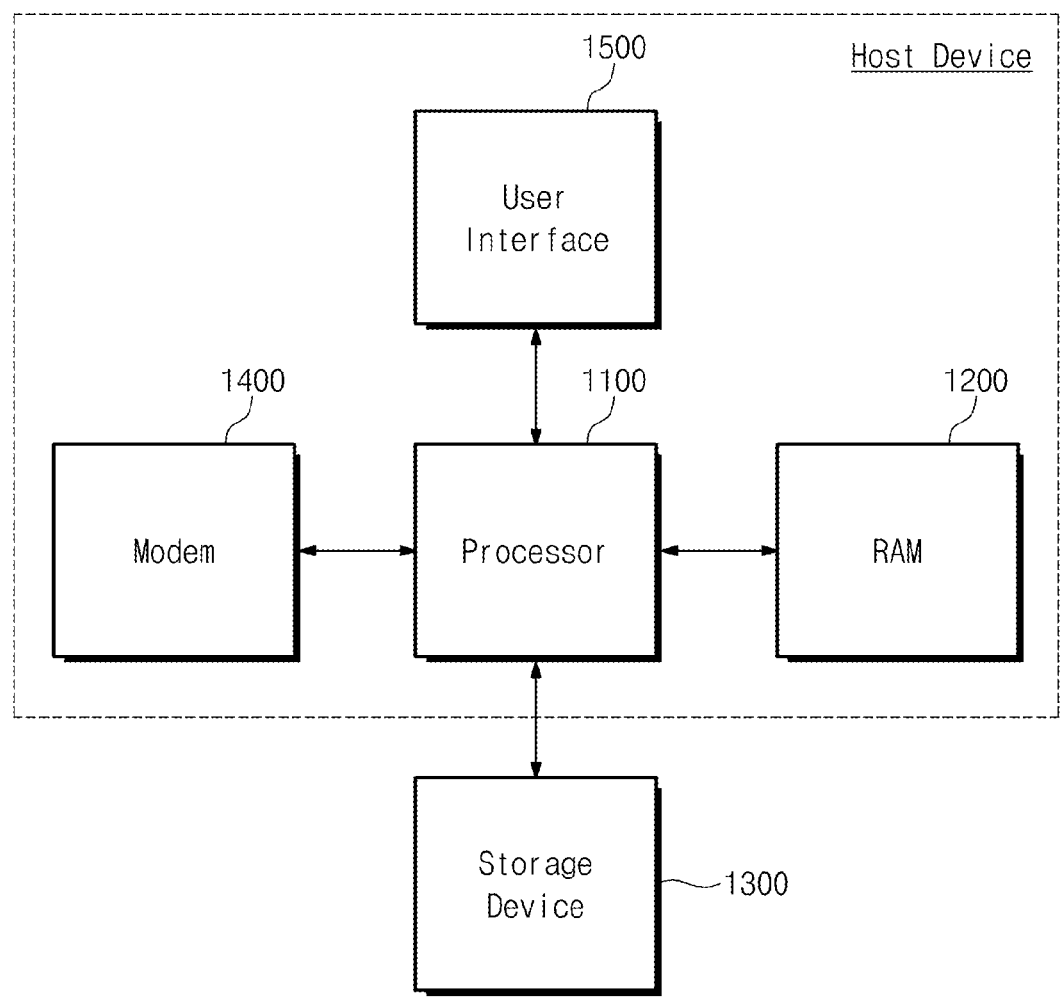
FIG. 19 is a block diagram illustrating a computing device according to embodiments of the inventive concept.

FIG. 19 is a block diagram illustrating a computing device 1000 according to an embodiment of the inventive concept. Referring to FIG. 19, a computing device 1000 includes a processor 1100, a RAM 1200, a storage device 1300, a modem 1400, and a user interface 1500.

The processor 1100 controls an overall operation of the computing device 1000 and performs a logical operation. The processor 1100 is formed of a system-on-chip (SoC). The processor 1100 may be a general purpose processor, a specific-purpose processor, or an application processor.

The RAM 1200 communicates with the processor 1100. The RAM 1200 may be a main memory of the processor 1100 or the computing device 1000. The processor 1100 stores codes or data in the RAM 1200 temporarily. The processor 1100 executes codes using the RAM 1200 to process data. The processor 1100 executes a variety of software, such as, but not limited to, an operating system and an application, using the RAM 1200. The processor 1100 controls an overall operation of the computing device 1000 using the RAM 1200. The RAM 1200 may include a volatile memory such as, but not limited to, a static RAM, a dynamic RAM, a synchronous DRAM, and so on or a nonvolatile memory such as, but not limited to, a Phase-change RAM (PRAM), a Magnetic RAM (MRAM), a Resistive RAM (RRAM), a Ferroelectric RAM (FRAM), and so on.

The storage device 1300 communicates with the processor 1100. The storage device 1300 is used to store data for a long time. That is, the processor 110 stores data, which is to be stored for a long time, in the storage device 1300. The storage device 1300 stores a boot image for driving the computing device 1000. The storage device 1300 stores source codes of a variety of software, such as an operating system and an application. The storage device 1300 stores data that is processed by a variety of software, such as an operating system and an application.

In exemplary embodiments, the processor 1100 loads source codes stored in the storage device 1300 on the RAM 1200. The codes loaded on the RAM 1200 are executed to run a variety of software, such as operating system, application, and so on. The processor 1100 loads data stored in the storage device 1300 on the RAM 1200 and processes data loaded on the RAM 1200. The processor 1100 stores long-term data of data stored in the RAM 1200 at the storage device 1300.

The storage device 1300 includes a nonvolatile memory, such as, but not limited to, a flash memory, a PRAM (Phase-change RAM), an MRAM (Magnetic RAM), an RRAM (Resistive RAM), an FRAM (Ferroelectric RAM), and so on.

The modem 1400 communicates with an external device according to a control of the processor 1100. For example, the modem 1400 communicates with the external device in a wire or wireless manner. The modem 1400 may communicate with the external device, based on at least one of wireless communications manners such as LTE (Long Term Evolution), WiMax, GSM (Global System for Mobile communication), CDMA (Code Division Multiple Access), Bluetooth, NFC (Near Field Communication), WiFi, RFID (Radio Frequency Identification, and so on or wire communications manners such as USB (Universal Serial Bus), SATA (Serial AT Attachment), HSIC (High Speed Interchip), SCSI (Small Computer System Interface), Firewire, PCI (Peripheral Component Interconnection), PCIe (PCI express), NVMe (NonVolatile Memory express), UFS (Universal Flash Storage), SD (Secure Digital), SDIO, UART (Universal Asynchronous Receiver Transmitter), SPI (Serial Peripheral Interface), HS-SPI (High Speed SPI), RS232, I2C (Inter-integrated Circuit), HS-I2C, I2S, (Integrated-interchip Sound), S/PDIF (Sony/Philips Digital Interface), MMC (MultiMedia Card), eMMC (embedded MMC), and so on.

The user interface 1500 communicates with a user according to a control of the processor 1100. For example, the user interface 1500 may include user input interfaces such as a keyboard, a keypad, a button, a touch panel, a touch screen, a touch pad, a touch ball, a camera, a microphone, a gyroscope sensor, a vibration sensor, and so on. The user interface 1500 may further include user output interfaces such as an LCD, an OLED (Organic Light Emitting Diode) display device, an AMOLED (Active Matrix OLED) display device, an LED, a speaker, a motor, and so on.

The storage device 1300 may include a storage device 100 according to an embodiment of the inventive concept. The processor 1100, RAM 1200, modem 1400, and user interface 1500 may constitute a host device that communicates with the storage device 1300.

While the inventive concept has been described with reference to exemplary embodiments, it will be apparent to those skilled in the art that various changes and modifications may be made without departing from the scope of the following claims.

What is claimed is:

1. A programming method for a nonvolatile memory including memory cells configured to store more than one data bit according to an erase state and a plurality of program states for write data provided to a page buffer, the method comprising:
    programming respective memory cells using data stored in corresponding first and second latches of the page buffer;
    performing verification read operations for the memory cells using different verification voltages respectively corresponding to the program states, and collecting verification read results for the verification read operations; and
    updating the first and second latches in response to the collected verification read results.

2. The method of claim 1, further comprising:
    initializing third latches respectively corresponding to the memory cells and selectively inverting data stored in the third latches corresponding to program-inhibited memory cells before collecting the verification read results for the verification read operations.

3. The method of claim 2, wherein the collecting of the verification read results for the verification read operations comprises:
    updating the data stored in third latches corresponding to memory cells having a threshold voltage higher than a first verification voltage; and
    initializing data stored in third latches corresponding to memory cells to be programmed to a program state other than a program state corresponding to the first verification voltage among the updated third latches.

4. The method of claim 3, wherein the collecting of the verification read results for the verification read operations comprises:
    updating data stored in third latches corresponding to memory cells having threshold voltages higher than a second verification voltage; and
    initializing data stored in third latches corresponding to memory cells to be programmed to a program state other than a program state corresponding to the second verification voltage among the updated third latches.

5. The method of claim 4, wherein the second verification voltage is higher than the first verification voltage.

6. The method of claim 4, wherein the collecting of the verification read results for the verification read operations further comprises:
    updating data stored in third latches corresponding to memory cells having threshold voltages higher than a third verification voltage.

7. The method of claim 6, wherein the third verification voltage is higher than the second verification voltage.

8. The method of claim 2, wherein the verification read operations are performed using different verification voltages having respective and increasing voltage levels,
    during each verification read operation having an associated verification voltage, data stored in third latches connected to memory cells having threshold voltages higher than the associated verification voltage is updated when the stored data is equal to an initialization value, and data stored in third latches, among the updated third latches, connected to memory cells programmed to a program state other than a program state corresponding to the associated verification voltage is initialized to the initialization value.

9. The method of claim 2, wherein the updating of the first and second data latches comprises:
    updating the first and second data latches connected to third latches each having a value different from an initialization value such that memory cells connected to the third latches each having the value different from the initialization value are program-inhibited.

10. The method of claim 9, wherein the programming of respective memory cells using data stored in corresponding first and second latches of the page buffer, the performing of the verification read operations for the memory cells using different verification voltages respectively corresponding to the program states, and the collecting of the verification read results for the verification read operations constitute a program loop,
    the program loop is iteratively performed until programming of the memory cells is passed, data stored in of the third latches are set based on data stored in the first and second data latches as updated per each iteratively performed program loop, and a program operation for each successive one of the iteratively performed program loops is controlled by data set to the third latches during a previous one of the iteratively performed program loops.

11. The method of claim 2, wherein the programming of respective memory cells using data stored in corresponding first and second latches of the page buffer, the performing of the verification read operations for the memory cells using different verification voltages respectively corresponding to the program states, and the collecting of the verification read results for the verification read operations constitute a program loop, the program loop is iteratively performed until programming of the memory cells is passed, and a program operation performed during a second program loop following a first program loop among the iteratively performed program loops is controlled by data set in the third latches during the first program loop.

12. The method of claim 1, further comprising:

before the programming the respective memory cells using data stored in corresponding first and second latches of the page buffer, loading write data to be programmed to the memory cells in the first and second latches.

13. The method of claim 1, further comprising:

before the programming of the respective memory cells using data stored in corresponding first and second latches of the page buffer, setting data in third latches depending on the data stored at the first and second latches, wherein the programming of the respective memory cells is performed based on the data set in the third latches.

14. The method of claim 1, wherein the programming of respective memory cells using data stored in corresponding first and second latches of the page buffer, the performing of the verification read operation for the memory cells using different verification voltages respectively corresponding to the program states, and the collecting of the verification read results for the verification read operations constitute a program loop, the program loop is iteratively performed until programming of the memory cells is passed, and the method further comprises:

after the programming of the respective memory cells using data stored in corresponding first and second latches of the page buffer during a current program loop and before collecting the verification read results for the verification read operations during the current program loop, determining whether the programming of the respective memory cells during the current program loop is passed or failed based on verification read results collected during a previous program loop.

15. A nonvolatile memory, comprising:

a memory cell array including memory cells respectively connected to a plurality of bit lines; and page buffers arranged in a page buffer circuit and respectively connected to the plurality of bit lines, wherein each page buffer comprises:

a latch; and a first data latch and a second data latch respectively connected to one of the bit lines, wherein during a verification read operation, latches connected to the plurality of bit lines are configured to collect verification read results over a plurality of verification read operations using different verification voltages respectively corresponding to different program states and update first data latches and second data latches corresponding to the latches depending on the collected verification read results.

16. The nonvolatile memory of claim 15, wherein the different program states correspond to different threshold voltage distribution ranges for programmed memory cells.

17. The nonvolatile memory of claim 15, wherein the memory cells are programmed according to values of the latches, and wherein the verification read operation is performed after the memory cells are programmed.

18. The nonvolatile memory of claim 15, wherein the memory cell array includes a plurality of cell strings arranged on a substrate in rows and columns, wherein each of the plurality of cell strings includes at least one ground selection transistor, a plurality of memory cell transistors, and at least one string selection transistor stacked on the substrate along a direction perpendicular to the substrate, and wherein the memory cells correspond to memory cell transistors placed in one row at the same height from the substrate and corresponds to memory cell transistors in one row.

19. An operating method of a nonvolatile memory which includes a plurality of memory cells respectively connected to a plurality of bit lines, first data latches respectively connected to the plurality of bit lines, and second data latches respectively connected to the plurality of bit lines, comprising:

programming the plurality of memory cells depending on data stored at the first and second data latches;

performing a first verification read operation for the plurality of memory cells using a first verification voltage and storing a result of the first verification read operation at latches respectively corresponding to the plurality of bit lines;

performing a second verification read operation for the plurality of memory cells using a second verification voltage and storing a result of the second verification read operation at the latches; and updating the first data latches and the second data latches depending on the results of the first and second verification read operations stored at the plurality of latches.

20. The operating method of claim 19, wherein the result of the second verification read operation is additionally stored at the plurality of latches in addition to the result of the first verification read operation.

* * * * *